(12) United States Patent
Chatham et al.

(10) Patent No.: US 11,913,143 B2
(45) Date of Patent: Feb. 27, 2024

(54) FABRIC WITH ELECTRICAL COMPONENTS

(71) Applicant: Apple Inc., Cupertino, CA (US)

(72) Inventors: Kyle L Chatham, San Jose, CA (US); Kathryn P. Crews, Menlo Park, CA (US); Didio V. Gomes, Sunnyvale, CA (US); Benjamin J. Grena, Sunnyvale, CA (US); Storrs T. Hoen, Brisbane, CA (US); Steven J. Keating, Sunnyvale, CA (US); David M. Kindlon, Felton, CA (US); Daniel A. Podhajny, San Jose, CA (US); Andrew L. Rosenberg, Sunnyvale, CA (US); Daniel D. Sunshine, Sunnyvale, CA (US); Lia M. Uesato, San Jose, CA (US); Joseph B. Walker, Campbell, CA (US); Felix Binder, Frick (CH); Bertram Wendisch, Stein (CH); Martin Latta, Zurich (CH); Ulrich Schläpfer, Affoltern am Albis (CH); Franck Robin, Lenzburg (CH); Michael Baumann, Zurich (CH); Helen Wächter Fischer, Schliern bei Köniz (CH)

(73) Assignee: Apple Inc., Cupertino, CA (US)

( * ) Notice: Subject to any disclaimer, the term of this patent is extended or adjusted under 35 U.S.C. 154(b) by 546 days.

(21) Appl. No.: 16/809,445

(22) Filed: Mar. 4, 2020

(65) Prior Publication Data
US 2020/0283935 A1 Sep. 10, 2020

Related U.S. Application Data

(60) Provisional application No. 62/872,659, filed on Jul. 10, 2019, provisional application No. 62/815,923, filed on Mar. 8, 2019.

(51) Int. Cl.
*D03D 1/00* (2006.01)
*H05K 1/03* (2006.01)
(Continued)

(52) U.S. Cl.
CPC ......... *D03D 1/0088* (2013.01); *B23K 1/0008* (2013.01); *D03D 41/00* (2013.01);
(Continued)

(58) Field of Classification Search
None
See application file for complete search history.

(56) References Cited

U.S. PATENT DOCUMENTS

| 231,809 | A | * | 8/1880 | Hardaker | D03J 1/22 |
| | | | | | 139/298 |
| 1,812,506 | A | * | 6/1931 | Willits | D03D 41/00 |
| | | | | | 139/291 R |

(Continued)

FOREIGN PATENT DOCUMENTS

| CN | 205295656 U | 6/2016 |
| CN | 206359734 U | 7/2017 |

(Continued)

OTHER PUBLICATIONS

"Tool Definition & Meaning." Merriam-Webster, Merriam-Webster, Aug. 9, 2018, https://www.merriam-webster.com/dictionary/tool. (Year: 2018).*

(Continued)

*Primary Examiner* — Grace Huang
(74) *Attorney, Agent, or Firm* — Treyz Law Group, P.C.; Kendall P. Woodruff

(57) ABSTRACT

Interlacing equipment may be used to form fabric and to create a gap in the fabric. The fabric may include one or more conductive strands. An insertion tool may be used to align an electrical component with the conductive strands
(Continued)

during interlacing operations. A soldering tool may be used to remove insulation from the conductive strands to expose conductive segments on the conductive strands. The soldering tool may be used to solder the conductive segments to the electrical component. The solder connections may be located in grooves in the electrical component. An encapsulation tool may dispense encapsulation material in the grooves to encapsulate the solder connections. After the electrical component is electrically connected to the conductive strands, the insertion tool may position and release the electrical component in the gap. A component retention tool may temporarily be used to retain the electrical component in the gap as interlacing operations continue.

14 Claims, 24 Drawing Sheets

(51) Int. Cl.
  *B23K 1/00* (2006.01)
  *D03J 1/00* (2006.01)
  *D03D 41/00* (2006.01)
(52) U.S. Cl.
  CPC ............... *D03J 1/00* (2013.01); *H05K 1/038* (2013.01); *D10B 2401/16* (2013.01); *D10B 2401/18* (2013.01)

(56) References Cited

U.S. PATENT DOCUMENTS

| | | | | |
|---|---|---|---|---|
| 2,113,492 | A * | 4/1938 | Philippe | D03D 13/002 139/11 |
| 4,140,156 | A * | 2/1979 | Trost | D03D 41/00 139/194 |
| 4,804,806 | A * | 2/1989 | Orr, Jr. | H01B 7/083 174/117 M |
| 5,435,352 | A * | 7/1995 | Yamamoto | D03D 11/00 139/55.1 |
| 5,771,793 | A * | 6/1998 | Kayser | D21G 1/00 100/95 |
| 5,783,278 | A * | 7/1998 | Nishimura | D03D 49/22 428/102 |
| 6,431,220 | B1 * | 8/2002 | Nakada | D03D 49/20 139/311 |
| 6,888,112 | B2 * | 5/2005 | Rock | D04B 1/04 66/170 |
| 7,022,917 | B2 * | 4/2006 | Jung | D03D 1/0082 174/94 R |
| 7,144,830 | B2 * | 12/2006 | Hill | D03D 1/0088 442/205 |
| 7,299,827 | B1 * | 11/2007 | Minamitani | D03D 51/002 139/370.1 |
| 8,922,100 | B2 * | 12/2014 | Whinnery | H01L 41/047 310/365 |
| 9,338,915 | B1 * | 5/2016 | Liu | H05K 1/11 |
| 9,926,651 | B2 * | 3/2018 | Khokar | D03D 3/08 |
| 10,066,829 | B2 * | 9/2018 | Wong | H05K 1/038 |
| 10,174,444 | B1 * | 1/2019 | Podhajny | D03D 15/00 |
| 10,338,757 | B2 * | 7/2019 | Karagozler | A41B 1/08 |
| 10,485,103 | B1 | 11/2019 | Sunshine et al. | |
| 10,550,497 | B1 * | 2/2020 | Sunshine | D03J 1/04 |
| 10,645,851 | B2 * | 5/2020 | Kondo | H05K 13/085 |
| 10,772,209 | B2 * | 9/2020 | Sunshine | D03D 15/533 |
| 10,851,481 | B1 * | 12/2020 | Sunshine | D03C 3/205 |
| 10,910,315 | B2 * | 2/2021 | Sunshine | A41D 27/205 |
| 11,076,664 | B1 * | 8/2021 | Podhajny | D03D 3/08 |
| 11,401,632 | B2 * | 8/2022 | Bogan | B32B 27/02 |
| 2007/0049147 | A1 * | 3/2007 | Hill | D03D 13/006 442/117 |
| 2009/0035530 | A1 | 2/2009 | Speich | |
| 2009/0146790 | A1 | 6/2009 | Speich | |
| 2009/0253325 | A1 * | 10/2009 | Brookstein | D03D 11/00 139/11 |
| 2010/0051699 | A1 | 3/2010 | Speich | |
| 2010/0085166 | A1 | 4/2010 | Speich | |
| 2013/0186505 | A1 * | 7/2013 | Cross | D03J 1/06 139/11 |
| 2013/0190917 | A1 * | 7/2013 | Cross | D03D 49/04 139/11 |
| 2015/0294756 | A1 * | 10/2015 | Ben Shalom | G01L 1/246 28/169 |
| 2017/0251555 | A1 | 8/2017 | Sunshine et al. | |
| 2019/0013274 | A1 | 1/2019 | Sunshine et al. | |
| 2019/0160279 | A1 * | 5/2019 | Farah | D03D 41/004 |
| 2019/0242036 | A1 * | 8/2019 | Bogan | D03D 1/0088 |
| 2020/0087823 | A1 * | 3/2020 | Coxeter | D03D 1/0088 |

FOREIGN PATENT DOCUMENTS

| | | |
|---|---|---|
| CN | 107002318 A | 8/2017 |
| CN | 107923081 A | 4/2018 |
| CN | 208562684 U | 3/2019 |
| DE | 102017100553 A1 | 7/2018 |
| WO | 2005071605 A2 | 8/2005 |
| WO | 2006029543 A1 | 3/2006 |
| WO | 2008011739 A1 | 1/2008 |
| WO | 2008034269 A1 | 3/2008 |
| WO | 2008098386 A1 | 8/2008 |
| WO | 2009000446 A1 | 12/2008 |
| WO | 2009003299 A1 | 1/2009 |
| WO | 2011095241 A1 | 8/2011 |
| WO | 2011154449 A1 | 12/2011 |
| WO | 2013026697 A1 | 2/2013 |
| WO | 2016062463 A1 | 4/2016 |
| WO | 2017042015 A1 | 3/2017 |
| WO | 2017216117 A1 | 12/2017 |
| WO | 2018010944 A1 | 1/2018 |

OTHER PUBLICATIONS

Annett Dörfel et al: "Entwicklung von Losungen zum Einweben von Inserts auf Band- und Breitwebmaschinen für Smart Textiles und Automobiltextilien" Jan. 13, 2011 (Jan. 13, 2011), XP055112401, Retrieved from the Internet: URL:http://tu-dresden.de/die_tu_dresden/fakultaeten/fakultaetmaschinenwesen/itrniforschungiforschungsthemen/inserts/i ndex_html [retrieved on Apr. 7, 2014] p. 2, paragraph 4—p. 6, paragraph 1.

* cited by examiner

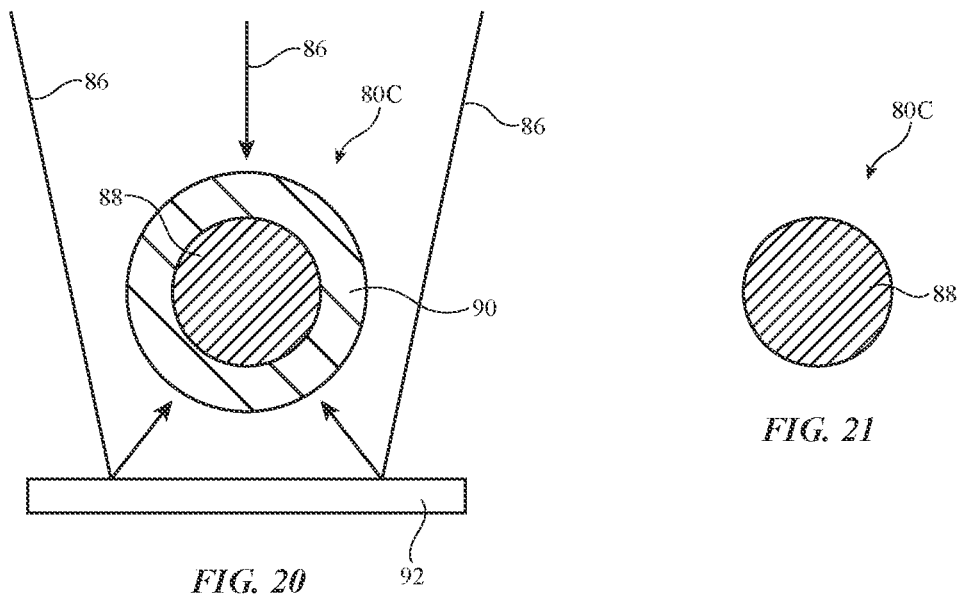
FIG. 20
FIG. 21
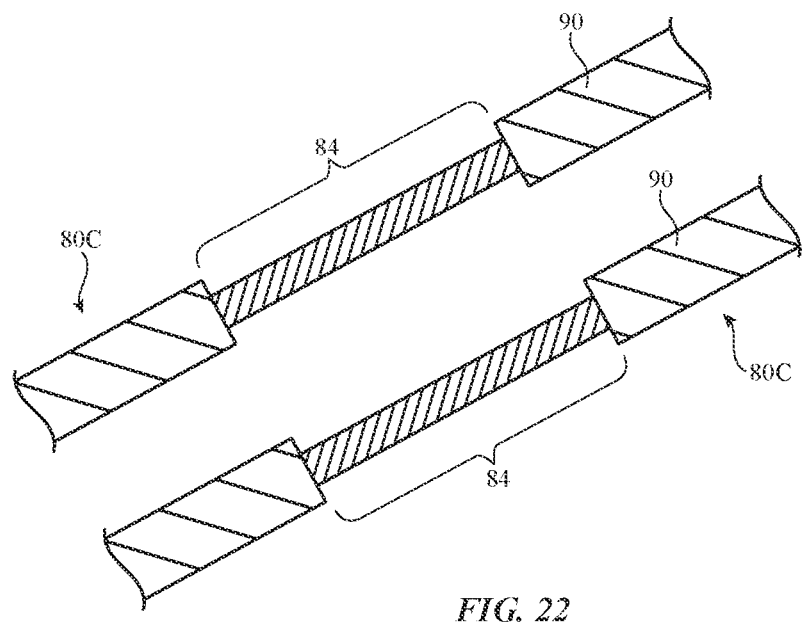
FIG. 22

FABRIC WITH ELECTRICAL COMPONENTS

This application claims the benefit of provisional patent application No. 62/815,923, filed Mar. 8, 2019, and provisional patent application No. 62/872,659, filed Jul. 10, 2019, both of which are hereby incorporated by reference herein in their entireties.

FIELD

This relates generally to items with fabric and, more particularly, to items with fabric and electrical components.

BACKGROUND

It may be desirable to form bags, furniture, clothing, and other items from materials such as fabric. Fabric items generally do not include electrical components. It may be desirable, however, to incorporate electrical components into fabric to provide a user of a fabric item with enhanced functionality.

It can be challenging to incorporate electrical components into fabric. Fabric is flexible, so it can be difficult to mount structures to fabric. Electrical components must be coupled to signal paths (e.g., signal paths that carry data signals, power, etc.), but unless care is taken, signal paths may be damaged, or components may become dislodged as fabric is bent and stretched.

It would therefore be desirable to be able to provide improved techniques for incorporating electrical components into items with fabric.

SUMMARY

Interlacing equipment (e.g., weaving equipment, knitting equipment, braiding equipment, etc.) may be provided with individually adjustable components. The use of individually adjustable components may allow electrical components to be inserted into and/or embedded in the fabric during the creation or formation of the fabric.

The interlacing equipment may create a gap between first and second fabric portions during interlacing operations. The gap may be a void between fabric portions or the gap may be a position or location between fabric portions. An insertion tool may insert an electrical component into the gap, and the electrical component may be electrically coupled to conductive strands in the gap. Interlacing operations may be uninterrupted during the insertion process, if desired. Following insertion and attachment of the electrical component, interlacing operations may continue and the electrical component may be enclosed in the fabric. In some arrangements, the gap between the first and second fabric portions may remain in place after the electrical component is enclosed in the fabric. In other arrangements, the first and second fabric portions may be pulled together such that the gap is eliminated after the electrical component is enclosed in the gap. The fabric may have a bulge where the electrical component is located, or the fabric may not have a bulge where the electrical component is located (e.g., the fabric may have substantially uniform thickness across locations with electrical components and locations without electrical components, if desired).

In an illustrative example, the interlacing equipment may include weaving equipment. Weaving equipment may include warp strand positioning equipment that positions warp strands and weft strand positioning equipment that inserts weft strands among the warp strands to form fabric. The fabric may include insulating strands and conductive strands. The conductive strands may be coupled to electrical components.

During formation of the fabric (e.g., during interlacing operations or while one or more interlacing components are repositioned or temporarily paused), strand processing operations and component insertion operations may take place. An insulation removal tool may remove insulation from conductive strands. Warp strand positioning equipment may position the conductive strands away from the other warp strands during insulation removal operations. The insulation removal tool may include a laser that ablates an outer insulating coating to expose a conductive core on each conductive strand.

Following insulation removal, interlacing may continue and a pocket (e.g., a void) may be formed in the fabric. The conductive strands may pass through the pocket. When it is desired to insert an electrical component, warp strand positioning equipment may be used to create a shed adjacent to the conductive strands. An insertion tool may be used to insert an electrical component into the shed. The insertion tool may align the conductive strands with grooves in the electrical component and may slide the electrical component along the conductive strands into the pocket until the grooves overlap the exposed conductive cores of the conductive strands.

While the insertion tool holds the electrical component in the pocket, a heating tool such as an inductive heating tool, hot air, or laser may be used to reflow solder between the electrical component and the conductive strands. If desired, heat may also be applied to melt an encapsulant material such as thermoplastic. The encapsulant material may cover the conductive strands and fill in the grooves to help encapsulate the solder connections. Following heating operations, weaving may continue and the pocket may be closed.

In some arrangements, certain processing operations may occur before the component is inserted into the fabric pocket. For example, insulation removal operations, electrical connection operations (e.g., soldering), encapsulation operations, and/or other processing operations may occur before the component is inserted into the fabric pocket. With this type of arrangement, the insertion tool may align the component with conductive strands that are initially located outside of the pocket. A spreading tool may spread apart warp strands to create an opening in an upper and/or lower portion of the shed. The opening in the shed may provide line-of-sight access to the component and may also provide physical access for processing equipment to reach the component. For example, an electrical connection tool such as a solder head may access the component through the shed opening to electrically connect the component to the conductive strands (e.g., by heating solder that has been previously applied to the component, by dispensing and heating solder on the component, by applying a conductive adhesive on the component, etc.). If desired, the heat from the solder head may also be used to remove insulation from the conductive strands at the time of soldering. An encapsulation tool may access the component through the shed opening to dispense an encapsulant around the electrical connection. If desired, other processing operations such as electrical connection verification operations may be performed before the component is inserted into the pocket. When the desired processing operations are complete, the insertion tool may insert and release the component along with the attached conductive strands, into the pocket. A component retention tool may, if desired, be used to hold the component in the pocket as the insertion tool is removed. Interlacing operations may continue, the pocket may be closed, and the component retention tool may be removed.

In addition to or instead of performing processing operations out-of-pocket, processing operations may be performed after the component is inserted into the pocket. For example, the component may have electrical contacts on a side portion of the component that is exposed along an open side of the pocket before the pocket is closed. A hot bar may be used to reflow solder on the electrical contacts of the component while the side of the component is exposed along the open side of the pocket. In other arrangements, a fabric opener may be used to create an opening in the fabric to provide access to the component in the pocket. The fabric opener may be used to open an already formed portion of the fabric or the fabric opener may be put in place while strands are interlaced around it, thereby creating an opening. When the desired processing operations are completed and access to the component is no longer needed, the opening may be closed. If desired, an endoscope or other optical sensing device may be used to obtain visual access of the component in the pocket. If desired, the endoscope may be a laser endoscope that produces laser light (e.g., for ablating insulation, melting solder, melting thermoplastic or other encapsulant, etc.).

The control circuitry may independently control the warp strand positioning equipment, the weft strand positioning equipment, the component insertion equipment, the reed, the take-down equipment, the warp tensioning equipment, the hold-down bar, the insulation removal equipment, and the heating equipment. As a result, these devices will not necessarily be simultaneously moving in synchronization but rather may be individually repositioned, and/or restarted as desired to accommodate component insertion operations and other operations.

BRIEF DESCRIPTION OF THE DRAWINGS

FIG. 20 is a cross-sectional side view of an illustrative strand showing how insulation may be selectively removed to expose a conductive core in accordance with an embodiment.

FIG. 21 is a cross-sectional side view of an illustrative strand from which insulation has been removed in accordance with an embodiment.

FIG. 22 is a top view of illustrative strands having portions from which insulation has been removed to expose conductive segments in accordance with an embodiment.

DETAILED DESCRIPTION

Electronic devices, enclosures, and other items may be formed from fabric such as woven fabric. The woven fabric may include strands of insulating and conductive material. Conductive strands may form signal paths through the fabric and may be coupled to electrical components such as light-emitting diodes and other light-emitting devices, integrated circuits, sensors, haptic output devices, and other circuitry.

Interlacing equipment (sometimes referred to as intertwining equipment) may include weaving equipment, knitting equipment, braiding equipment, or any other suitable equipment used for crossing, looping, overlapping, or otherwise coupling strands of material together to form a network of strands (e.g., fabric). Interlacing equipment may be provided with individually adjustable components such as warp strand positioning equipment (e.g., heddles or other warp strand positioning equipment), weft strand positioning equipment, a reed, take-down equipment, let off equipment (e.g., devices for individually dispensing and tensioning warp strands), needle beds, feeders, guide bars, strand processing and component insertion equipment, and other components for forming fabric items. The individual adjustability of these components may allow interlacing operations (e.g., weaving operations, knitting operations, braiding operations, and/or other interlacing operations) to be performed without requiring continuous lock-step synchronization of each of these devices, thereby allowing fabric with desired properties to be woven. As an example, normal reed movement and other weaving operations may be periodically suspended and/or may periodically be out-of-sync with other components to accommodate component insertion operations whereby electrical components (sometimes referred to as nodes or smart nodes) are inserted into the fabric during the creation or formation of the fabric.

Figure 1:
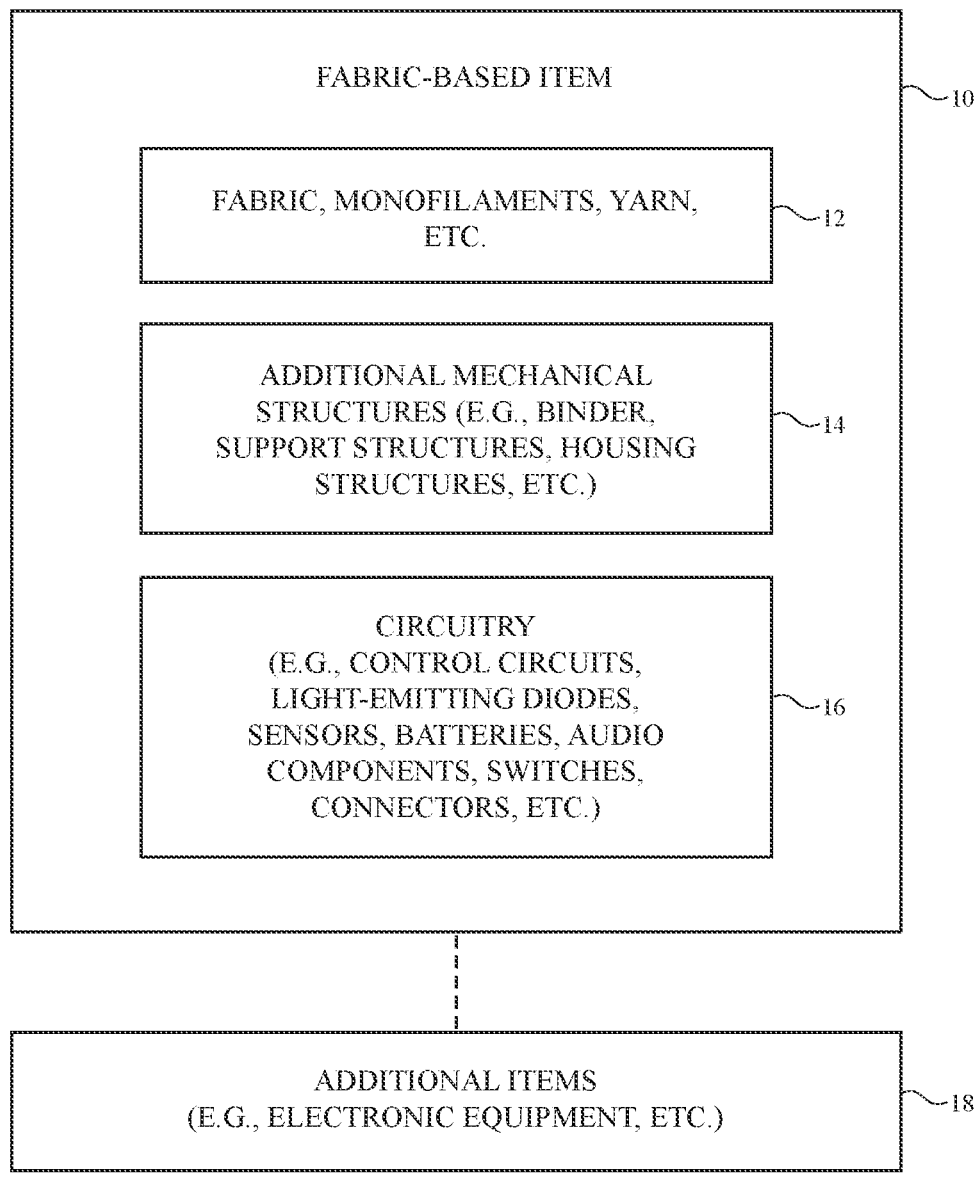
FIG. 1 is a schematic diagram of an illustrative fabric item in accordance with an embodiment.

Items such as item 10 of FIG. 1 may include fabric and may sometimes be referred to as a fabric item or fabric-based item. Item 10 may be an electronic device or an accessory for an electronic device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric item 10 is mounted in a kiosk, in an automobile, airplane, or other vehicle (e.g., an autonomous or non-autonomous vehicle), other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, etc.), or may be any other suitable item that incorporates fabric.

Item 10 may include interlaced strands of material such as monofilaments and yarns that form fabric 12. As used herein, "interlaced" strands of material and "intertwined" strands of material may both refer to strands of material that are crossed with one another, looped with one another, overlapping one another, or otherwise coupled together (e.g., as part of a network of strands that make up a fabric). Fabric 12 may form all or part of a housing wall or other layer in an electronic device, may form internal structures in an electronic device, or may form other fabric-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

The strands of material used in forming fabric 12 may be single-filament strands (sometimes referred to as fibers) or may be threads, yarns, or other strands that have been formed by interlacing multiple filaments of material together. Strands may be formed from polymer, metal, glass, graphite, ceramic, natural materials such as cotton or bamboo, or other organic and/or inorganic materials and combinations of these materials. Conductive coatings such as metal coatings may be formed on non-conductive strands (e.g., plastic cores) to make them conductive. Reflective coatings such as metal coatings may be applied to strands to make them reflective. Strands may also be formed from single-filament metal wire (e.g., bare metal wire), multifilament wire, or combinations of different materials. Strands may be insulating or conductive.

Strands in fabric 12 may be conductive along their entire lengths or may have conductive portions. Strands may have metal portions that are selectively exposed by locally removing insulation (e.g., to form connections with other conductive strand portions and/or to form connections with electrical components). Strands may also be formed by selectively adding a conductive layer to a portion of a non-conductive strand). Threads and other multifilament yarns that have been formed from interlaced filaments may contain mixtures of conductive strands and insulating strands (e.g., metal strands or metal coated strands with or without exterior insulating layers may be used in combination with solid plastic strands or natural strands that are insulating). In some arrangements, which may sometimes be described herein as an example, fabric 12 may be a woven fabric and the strands that make up fabric 12 may include warp strands and weft strands.

Conductive strands and insulating strands may be woven, knit, or otherwise interlaced to form conductive paths. The conductive paths may be used in forming signal paths (e.g., signal buses, power lines for carrying power, etc.), may be used in forming part of a capacitive touch sensor electrode, a resistive touch sensor electrode, or other input-output device, or may be used in forming other patterned conductive structures. Conductive structures in fabric 12 may be used in carrying electrical current such as power, digital signals, analog signals, sensor signals, control signals, data, input signals, output signals, or other suitable electrical signals.

Item 10 may include additional mechanical structures 14 such as polymer binder to hold strands in fabric 12 together, support structures such as frame members, housing structures (e.g., an electronic device housing), and other mechanical structures.

To enhance mechanical robustness and electrical conductivity at strand-to-strand connections and/or strand-to-component connections, additional structures and materials (e.g., solder, crimped metal connections, welds, conductive adhesive such as anisotropic conductive film and other conductive adhesive, non-conductive adhesive, fasteners, etc.) may be used in fabric 12. Strand-to-strand connections may be formed where strands cross each other perpendicularly or at other strand intersections where connections are desired. Insulating material can be interposed between intersecting conductive yarns at locations in which it is not desired to form a strand-to-strand connection. The insulating material may be plastic or other dielectric, may include an insulating strand or a conductive strand with an insulating coating or insulated conductive monofilaments, etc. Solder connections may be formed between conductive strands and/or between conductive strands and electrical components by melting solder so that the solder flows over conductive strands. The solder may be melted using an inductive soldering head to heat the solder, using hot air to heat the solder, using a reflow oven to heat the solder, using a laser or hot bar to heat the solder, or using other soldering equipment. In some arrangements, outer dielectric coating layers (e.g., outer polymer layers) may be melted away in the presence of molten solder, thereby allowing underlying metal yarns to be soldered together. In other arrangements, outer dielectric coating layers may be removed prior to soldering (e.g., using laser ablation equipment or other coating removal equipment).

Circuitry 16 may be included in item 10. Circuitry 16 may include electrical components that are coupled to fabric 12, electrical components that are housed within an enclosure formed by fabric 12, electrical components that are attached to fabric 12 using welds, solder joints, adhesive bonds (e.g., conductive adhesive bonds such as anisotropic conductive adhesive bonds or other conductive adhesive bonds), crimped connections, or other electrical and/or mechanical bonds. Circuitry 16 may include metal structures for carrying current, electrical components such as integrated circuits, light-emitting diodes, sensors, and other electrical devices. Control circuitry in circuitry 16 may be used to control the operation of item 10 and/or to support communications with item 18 and/or other devices.

Item 10 may interact with electronic equipment or other additional items 18. Items 18 may be attached to item 10 or item 10 and item 18 may be separate items that are configured to operate with each other (e.g., when one item is a case and the other is a device that fits within the case, etc.). Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a cover, case, bag, or other structure that receives the electronic device in a pocket, an interior cavity, or other portion of item 10. In other situations, item 18 may be a wrist-watch device or other electronic device and item 10 may be a strap or other fabric item that is attached to item 18 (e.g., item 10 and item 18 may together form a fabric-based item such as a wrist-watch with a strap). In still other situations, item 10 may be an electronic device, fabric 12 may be used in forming the electronic device, and additional items 18 may include accessories or other devices that interact with item 10. Signal paths formed from conductive yarns and monofilaments may be used to route signals in item 10 and/or item(s) 18.

The fabric that makes up item 10 may be formed from yarns and/or monofilaments that are interlaced using any suitable interlacing equipment. With one suitable arrangement, which may sometimes be described herein as an example, fabric 12 may be woven fabric formed using a weaving machine. In this type of illustrative configuration, fabric may have a plain weave, a basket weave, a satin weave, a twill weave, or variations of these weaves, may be a three-dimensional woven fabric, or may be other suitable fabric. This is, however, merely illustrative. If desired, fabric 12 may include knit fabric, warp knit fabric, weft knit fabric, braided fabric, other suitable type of fabric, and/or a combination of any two or more of these types of fabric.

Figure 2:
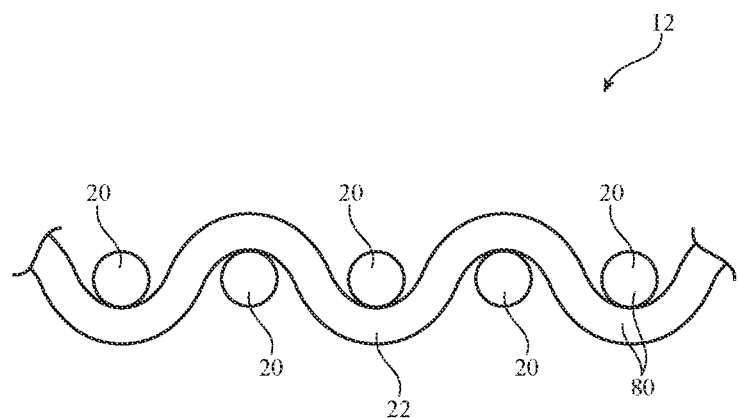
FIG. 2 is a side view of illustrative fabric in accordance with an embodiment.

A cross-sectional side view of illustrative woven fabric 12 is shown in FIG. 2. As shown in FIG. 2, fabric 12 may include strands 80. Strands 80 may include warp strands 20 and weft strands 22. If desired, additional strands that are neither warp nor weft strands may be incorporated into fabric 12. The example of FIG. 2 is merely illustrative. In the illustrative configuration of FIG. 2, fabric 12 has a single layer of woven strands 80. Multi-layer fabric constructions may be used for fabric 12 if desired.

Figure 3:
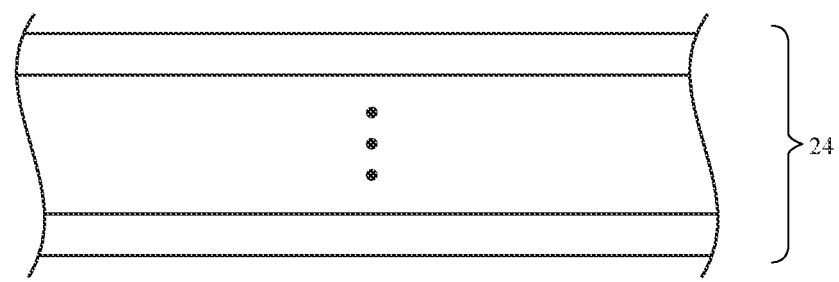
FIG. 3 is a side view of layers of material that may be incorporated into a fabric item in accordance with an embodiment.

Item 10 may include non-fabric materials (e.g., structures formed from plastic, metal, glass, ceramic, crystalline materials such as sapphire, etc.). These materials may be formed using molding operations, extrusion, machining, laser processing, and other fabrication techniques. In some configurations, some or all of item 10 may include one or more layers of material such as layers 24 of FIG. 3. Layers 24 may include layers of polymer, metal, glass, fabric, adhesive, crystalline materials, ceramic, substrates on which components have been mounted, patterned layers of material, layers of material containing patterned metal traces, thin-film devices such as transistors, and/or other layers.

Figure 4:
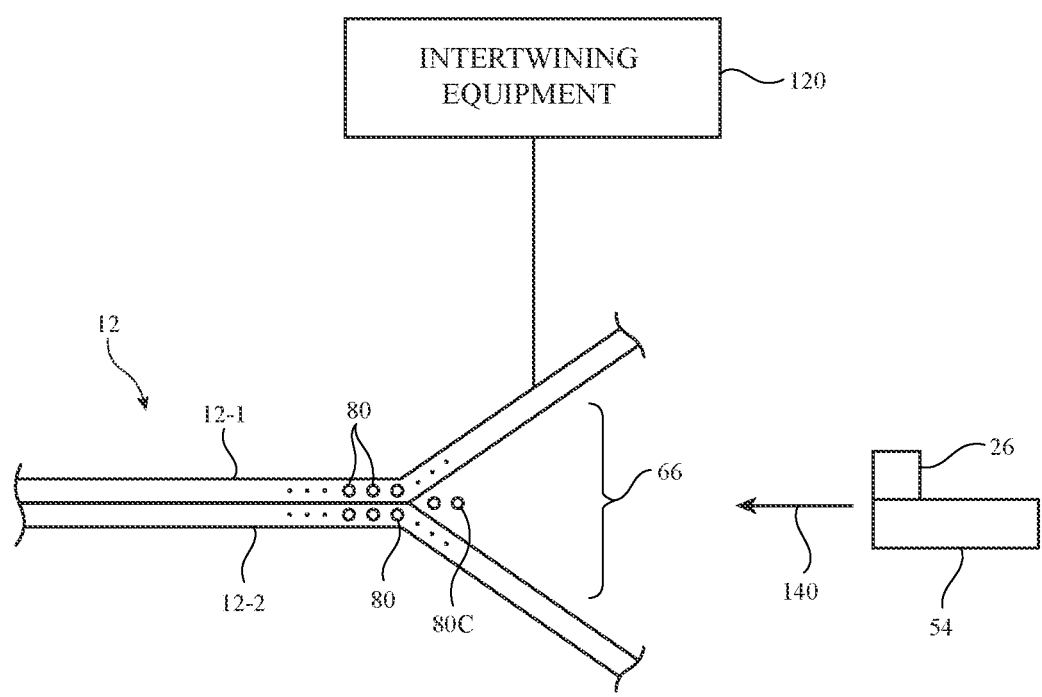
FIG. 4 is a diagram illustrating how interlacing equipment may be used to create fabric while an insertion tool is used to insert electrical components into the fabric in accordance with an embodiment.

A diagram illustrating how electrical components may be inserted into fabric 12 during the formation of fabric 12 is illustrated in FIG. 4. As shown in FIG. 4, fabric 12 may be formed from fabric portions such as fabric portions 12-1 and 12-2. Fabric portions 12-1 and 12-2 may be formed from interlaced strands 80. For example, a first set of strands 80 may be used to form fabric portion 12-1 and a second set of strands 80 may be used to form fabric portion 12-2. Fabric portions 12-1 and 12-2 may be different portions of a single layer of fabric 12, or fabric portion 12-1 may form a first layer of fabric 12 and fabric portion 12-2 may form a second layer of fabric 12.

Using interlacing equipment 120, strands 80 may be interlaced to form fabric 12. Interlacing equipment 120 may be weaving equipment, knitting equipment, braiding equipment, or other suitable interlacing equipment. Interlacing equipment 120 may be used to create one or more regions in fabric 12 such as pocket 66 (sometimes referred to as a gap, space, cavity, void, position, location, etc.) for receiving electrical components. Regions in fabric 12 that receive electrical components such as pocket 66 may be formed by creating a space or gap between portions of fabric 12 such as fabric portion 12-1 and fabric portion 12-2. The term "pocket" may be used to refer to a void between fabric portions and/or may be used to refer to a position or location between fabric portions (e.g., a position between strands of material in fabric 12).

Electrical components may be inserted into pocket 66 during the formation of fabric 12 using component insertion equipment such as insertion tool 54. Insertion tool 54 may hold component 26 and may position component 26 in pocket 66 during interlacing operations (e.g., by moving component 26 towards pocket 66 in direction 140). If desired, component 26 may be electrically and mechanically connected to one or more conductive strands 80C in pocket 66. Following insertion and attachment of component 26, interlacing equipment 120 may continue interlacing operations (which may include closing pocket 66, if desired) to continue forming fabric 12.

Figure 25:
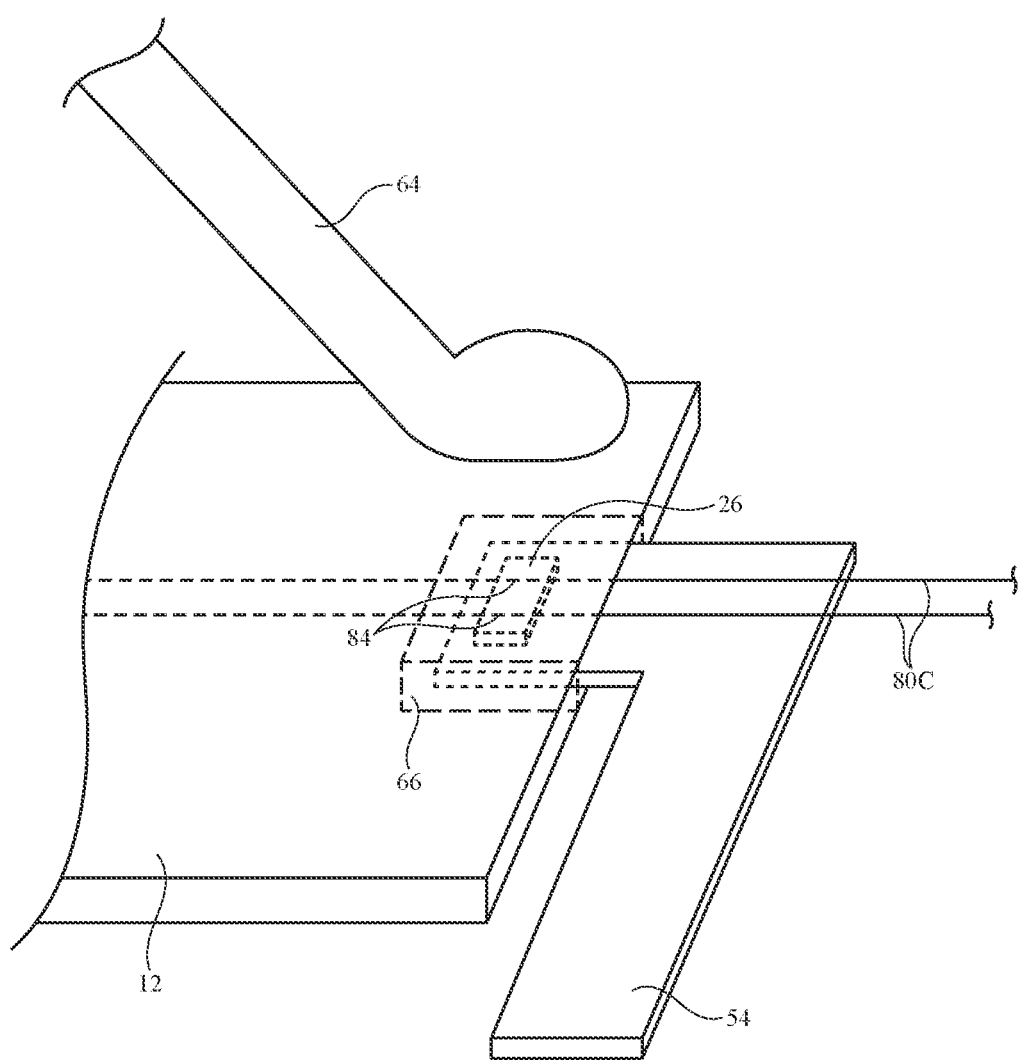
FIG. 25 is a perspective view of an illustrative insertion tool being used to insert an electrical component into a fabric pocket and a heating tool being used to solder the electrical component to conductive strands in accordance with an embodiment.
Figure 31:
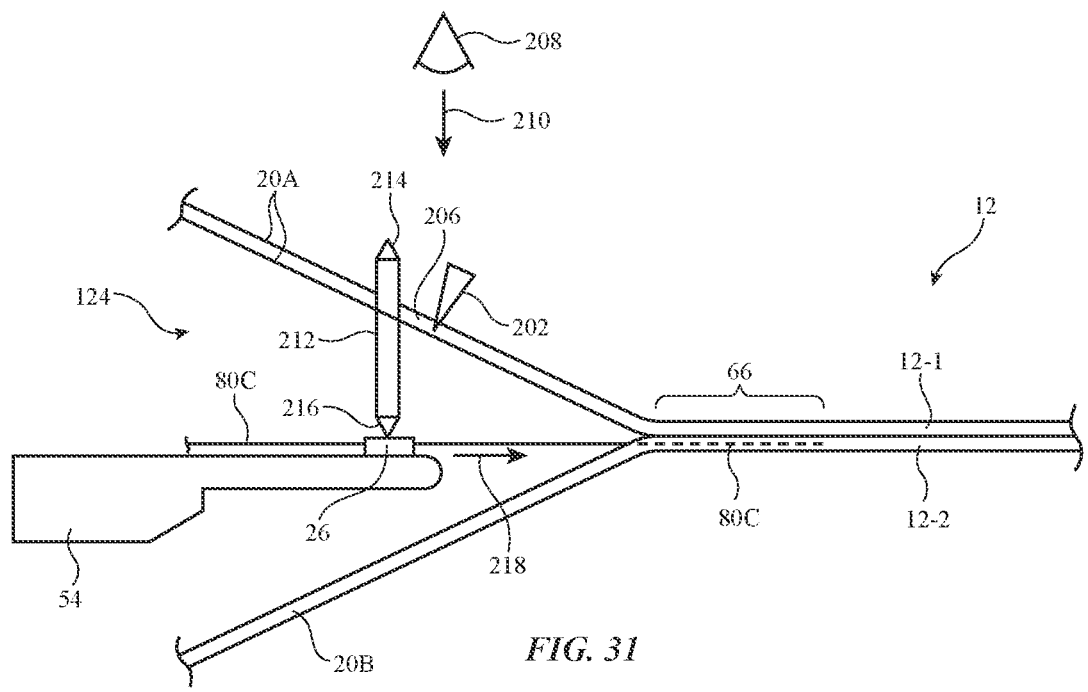
FIG. 31 is a side view showing how equipment such as soldering and encapsulation equipment may access an electrical component through a shed opening held open by a spreading tool in accordance with an embodiment.

In some arrangements, processing steps such as alignment of component 26 with conductive strands 80C, electrically connecting (e.g., soldering) component 26 to conductive strands 80C, encapsulation of the electrical connection between component 26 and conductive strands 80C, and/or verification of the integrity of the electrical connection between component 26 and conductive strands 80C may be performed after component 26 is inserted into pocket 66. An illustrative example of in-pocket soldering, for instance, is shown in FIG. 25 (described later). In other arrangements, one or more of these processing steps may be performed before component 26 is inserted into pocket 66 for easier access to component 26. FIG. 31 (also described later) shows an illustrative example of out-of-pocket soldering.

In some arrangements, the gap between first and second fabric portions 12-1 and 12-2 may remain in place after electrical component 26 is enclosed in fabric 12 (e.g., a space may exist between fabric portions 12-1 and 12-2 after formation of fabric 12 is complete). In other arrangements, first and second fabric portions 12-1 and 12-2 may be pulled together such that gap 66 is eliminated after electrical component 26 is enclosed in the gap (e.g., fabric portions 12-1 and 12-2 may be in contact with one another without an intervening gap after the formation of fabric 12 is complete). Fabric 12 may have a bulge where electrical component 26 is located, or fabric 12 may not have a bulge where electrical component 26 is located (e.g., the fabric may have substantially uniform thickness across locations with electrical components 26 and locations without electrical components 26, if desired).

Figure 5:
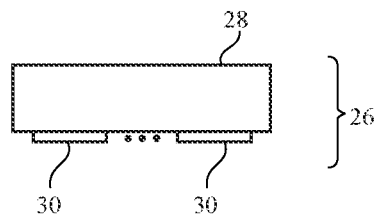
FIG. 5 is a cross-sectional side view of an illustrative electrical component in accordance with an embodiment.

A side view of an illustrative electrical component of the type that may be used in item 10 is shown in FIG. 5. Electrical components in item 10 such as illustrative electrical component 26 of FIG. 5 may include discrete electrical components such as resistors, capacitors, and inductors, may include connectors, may include batteries, may include input-output devices such as switches, buttons, light-emitting components such as light-emitting diodes, audio components such as microphones and speakers, vibrators (e.g., piezoelectric actuators that can vibrate), solenoids, electromechanical actuators, motors, and other electromechanical devices, microelectromechanical systems (MEMs) devices, pressure sensors, light detectors, proximity sensors (light-based proximity sensors, capacitive proximity sensors, etc.), force sensors (e.g., piezoelectric force sensors), strain gauges, moisture sensors, temperature sensors, accelerometers, gyroscopes, compasses, magnetic sensors (e.g., Hall effect sensors and magnetoresistance sensors such as giant magnetoresistance sensors), touch sensors, and other sensors, components that form displays, touch sensors arrays (e.g., arrays of capacitive touch sensor electrodes to form a touch sensor that detects touch events in two dimensions), and other input-output devices, electrical components that form control circuitry such as non-volatile and volatile memory, microprocessors, application-specific integrated circuits, system-on-chip devices, baseband processors, wired and wireless communications circuitry, and other integrated circuits.

Electrical components such as component 26 may be bare semiconductor dies (e.g., laser dies, light-emitting diode dies, integrated circuits, etc.) or packaged components (e.g. semiconductor dies or other devices packaged within plastic packages, ceramic packages, or other packaging structures). One or more electrical terminals such as contact pads 30 may be formed on body 28 of component 26. Body 28 may be a semiconductor die (e.g., a laser die, light-emitting diode die, integrated circuit, etc.) or may be a package for a component (e.g., a plastic package or other dielectric package that contains one or more semiconductor dies or other electrical devices). Contacts for body 28 such as pads 30 may be protruding leads, may be planar contacts, may be formed in an array, may be formed on any suitable surfaces of body 28, or may be any other suitable contacts for forming electrical connections to component 26. For example, pads 30 may be metal solder pads.

Figure 6:
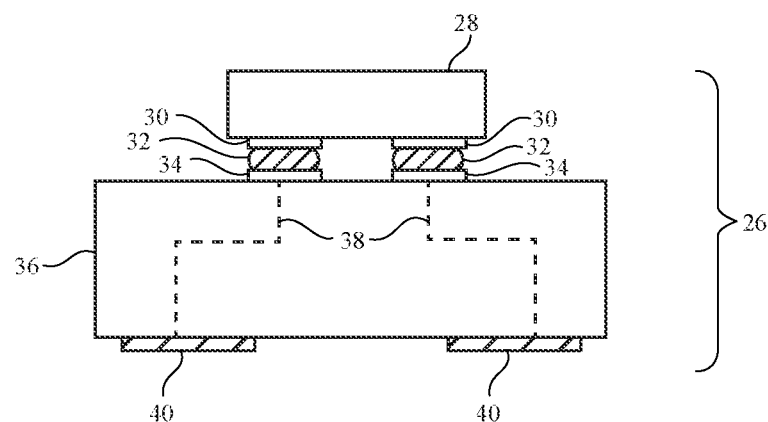
FIG. 6 is a cross-sectional side view of an illustrative electrical component having an electrical device mounted on an interposer in accordance with an embodiment.

As shown in the example of FIG. 6, body 28 may be mounted on a support structure such as interposer 36. Interposer 36 may be a printed circuit, ceramic carrier, or other dielectric substrate. Interposer 36 may be larger than body 28 or may have other suitable sizes. Interposer 36 may have a planar shape with a thickness of 700 microns, more than 500 microns, less than 500 microns, or other suitable thickness. The thickness of body 28 may be 500 microns, more than 300 microns, less than 1000 microns, or other suitable thickness. The footprint (area viewed from above) of body 28 and interposer 36 may be 10 microns×10 microns, 100 microns×100 microns, more than 1 mm×1 mm, less than 10 mm×10 mm, may be rectangular, may be square, may have L-shapes, or may have other suitable shapes and sizes.

Interposer 36 may contain signal paths such as metal traces 38. Metal traces 38 may have portions forming contacts such as pads 34 and 40. Pads 34 and 40 may be formed on the upper surface of interposer 36, on the lower surface of interposer 36, or on the sides of interposer 36. Conductive material such as conductive material 32 may be used in mounting body 28 to interposer 36. Conductive material 32 may be solder (e.g., low temperature or high temperature solder), may be conductive adhesive (isotropic conductive adhesive or anisotropic conductive film), may be formed during welding, or may be other conductive material for coupling electrical device pads (body pads) such as pads 30 on body 28 to interposer pads 34. Metal traces 38 in interposer 36 may couple pads 34 to other pads such as pads 40. If desired, pads 40 may be larger and/or more widely spaced than pads 34, thereby facilitating attachment of interposer 36 to conductive yarns and/or other conductive paths in item 10. Solder, conductive adhesive, or other conductive connections may be used in coupling pads 40 to conductive yarn, conductive monofilament, printed circuit traces, or other conductive path materials in item 10.

Figure 7:
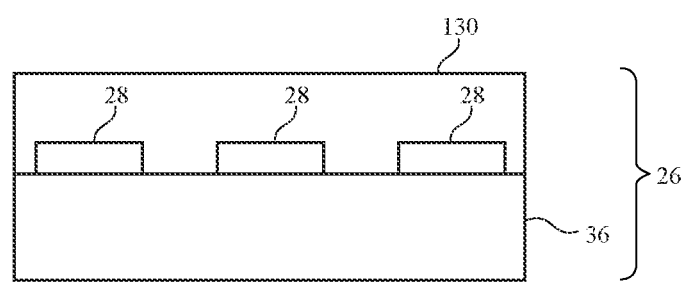
FIG. 7 is a cross-sectional side view of an illustrative electrical component having a protective structure in accordance with an embodiment.

FIG. 7 shows an example in which component 26 includes a protective structure such as protective structure 130 on interposer 36. Protective structure 130 may, for example, be a plastic structure that completely or partially encapsulates devices 28 and interposer 36 to provide mechanical robustness, protection from moisture and other environmental contaminants, heat sinking, and/or electrical insulation. Protective structure 130 may be formed from molded plastic (e.g., injection-molded plastic, transfer molded plastic, low-pressure molded plastic, two-part molded plastic, etc.) that has been molded over devices 28 and interposer 36 or that is pre-formed into the desired shape and subsequently attached to interposer 36, may be a layer of encapsulant material (e.g., thermoplastic) that has been melted to encapsulate devices 28, may be a layer of polymer such as polyimide that has been cut or machined into the desired shape and subsequently attached to interposer 36, or may be formed using other suitable methods. Illustrative materials that may be used to form protective structure 130 include epoxy, polyamide, polyurethane, silicone, other suitable materials, or a combination of any two or more of these materials. Protective structure 130 may be formed on one or both sides of interposer 36 (e.g., may completely or partially surround interposer 36).

Protective structure 130 may be entirely opaque, may be entirely transparent, or may have both opaque and transparent regions. Transparent portions of protective structure 130 may allow light emitted from one or more devices 28 to be transmitted through protective structure 130 and/or may allow external light to reach (and be detected by) one or more devices 28. Protective structure 130 may, if desired, have different thicknesses. The example of FIG. 7 in which protective structure 130 has uniform thickness across interposer 36 is merely illustrative. In some arrangements, protective structure 130 may be an encapsulant material such as thermoplastic that has been melted to create a robust connection between component 26 and strands 80 of fabric 12. For example, protective structure 130 may surround portions of strands 80, may fill recesses, grooves, or other features in component 26 to help interlock component 26 to strands 80, and/or may fill gaps in fabric 12.

If desired, interposer 36 may be sufficiently large to accommodate multiple electrical devices each with a respective body 28. For example, one or more light-emitting diodes, sensors, microprocessors, and/or other electrical devices may be mounted to a common interposer such as interposer 36 of FIG. 7. The light-emitting diodes may be micro-light-emitting diodes (e.g., light-emitting diode semiconductor dies having footprints of about 10 microns×10 microns, more than 5 microns×5 microns, less than 100 microns×100 microns, or other suitable sizes). The light-emitting diodes may include light-emitting diodes of different colors (e.g., red, green, blue, white, etc.), infrared light, or ultraviolet light. Redundant light-emitting diodes or other redundant circuitry may be included on interposer 36. In configurations of the type shown in FIG. 7 in which multiple electrical devices (each with a respective body 28) are mounted on a common interposer, electrical component 26 may include any suitable combination of electrical devices (e.g., light-emitting diodes, sensors, integrated circuits, actuators, and/or other devices of the type described in connection with electrical component 26 of FIG. 5).

The examples of FIGS. 6 and 7 in which devices 28 are only located on one side of interposer 36 are merely illustrative. If desired, devices 28 may be mounted to both sides of interposer 36.

Electrical components 26 may be coupled to fabric structures, individual strands, printed circuits (e.g., rigid printed circuits formed from fiberglass-filled epoxy or other rigid printed circuit board material or flexible printed circuits formed from polyimide substrate layers or other sheets of flexible polymer materials), metal or plastic parts with signal traces, or other structures in item 10.

Figure 8:
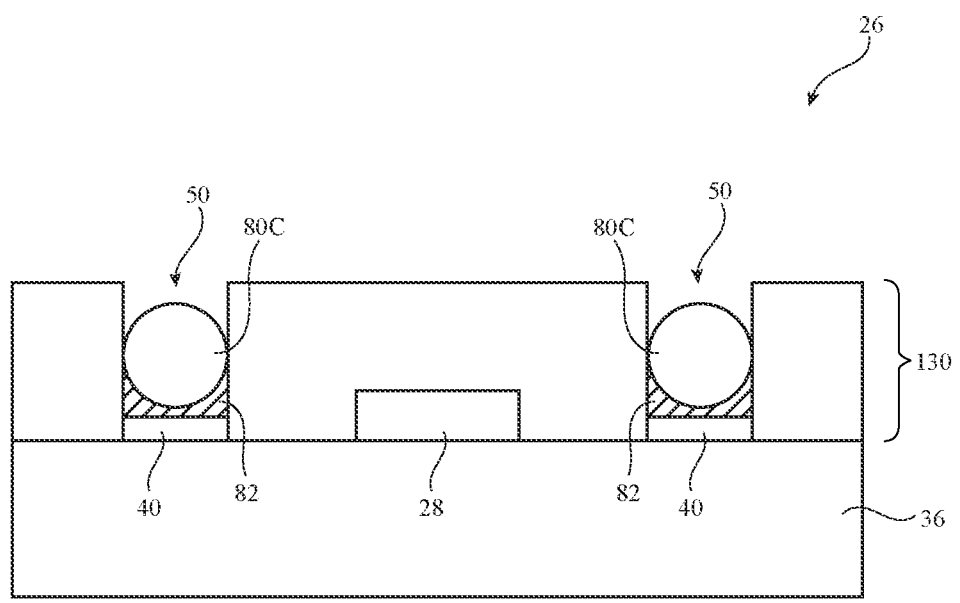
FIG. 8 is a cross-sectional side view of an illustrative electrical component having recesses for receiving strands in accordance with an embodiment.

In some configurations, item 10 may include electrical connections between components 26 and conductive paths in fabric 12. As shown in FIG. 8, for example, component 26 may be coupled to conductive strands 80C of fabric 12. Conductive strands 80C (sometimes referred to as "wires") may be configured to carry electrical signals (e.g., power, digital signals, analog signals, sensor signals, control signals, data, input signals, output signals, or other suitable electrical current) to and/or from components 26. Strands 80C may be warp strands (e.g., warp strands 20 of FIG. 2), weft strands (e.g., weft strands 22 of FIG. 2), or other suitable strands 80 in fabric 12. One or more of strands 80C may be conductive. If desired, component 26 may be coupled to only a single conductive strand 80C, may be coupled to two conductive strands 80C, or may be coupled to three or more conductive strands 80C. Arrangements in which component 26 is coupled to a pair of conductive strands 80C are sometimes described herein as an illustrative example.

Component 26 may have contact pads such as pad 40. Solder or other conductive material 82 may be used to couple pads 40 to conductive strands 80C. In the example of FIG. 8, pads 40 are formed on an upper surface of interposer 36 (e.g., the same surface on which device 28 is mounted). Conductive material 82 may be used to electrically and mechanically couple component 26 to strands 80C of fabric 12. If desired, pads 40 may instead or may be additionally formed on the lower surface of interposer 36 (e.g., the surface opposite the surface on which device 28 is mounted). The example of FIG. 8 is merely illustrative.

In some configurations, it may be desirable to provide a more robust mechanical connection between component 26 (e.g., component 26 of FIG. 5, 6, 7, or 8) and fabric 12 to ensure that component 26 does not come loose when fabric 12 is bent or stretched. To increase the robustness of the connection between strands 80C and component 26, component 26 may have one or more recesses for receiving strands 80C. For example, strands 80C may each be threaded through a portion of component 26 to help secure component 26 to fabric 12. Strands 80C may be threaded through recesses, openings, trenches, grooves, holes, and/or other engagement features of component 26. The recesses, openings, trenches, grooves, holes, or other engagement features may be formed in device 28, interposer 36, protective structure 130, and/or other portions of component 26. FIG. 8 shows an example in which conductive strands 80C are received within grooves such as grooves 50 that are formed in protective structure 130. This is, however, merely illustrative. If desired, grooves 50 may instead or additionally be formed in interposer 36, device 28, and/or other portions of component 26. The location, shape, and geometry of grooves 50 of FIG. 8 are merely illustrative.

Grooves 50 (sometimes referred to as trenches, openings, notches, recesses, etc.) in protective structure 130 may be formed by removing portions of protective structure 130 (e.g., using a laser, a mechanical saw, a mechanical mill, or other equipment) or may be formed by molding (e.g., injection molding) or otherwise forming protective structure 130 into a shape that includes grooves 50. Grooves 50 may have a width between 2 mm and 6 mm, between 0.3 mm and 1.5 mm, between 1 mm and 5 mm, between 3 mm and 8 mm, greater than 3 mm, less than 3 mm, or other suitable width. If desired, trenches 50 may have different depths (e.g., to expose contact pads 40 that are located at different surface heights of interposer 36).

Grooves 50 may expose conductive pads 40 on interposer 36. Strands 80C may each be threaded through an associated one of grooves 50 in protective structure 130. Solder or other conductive material 82 may be used to electrically and mechanically couple strands 80C to conductive pads 40 in grooves 50 of protective cover 130. Because strands 80C are wedged between portions of protective cover 130, strands 80C may be resistant to becoming dislodged from interposer 36. In addition to holding strands 80C in place so that component 26 remains attached to fabric 12, grooves 50 may also be used as a physical guide for aligning component 26 relative to fabric 12 during component insertion and attachment operations. This may be beneficial when inserting and attaching component 26 to fabric 12 without line of sight.

Figure 9:
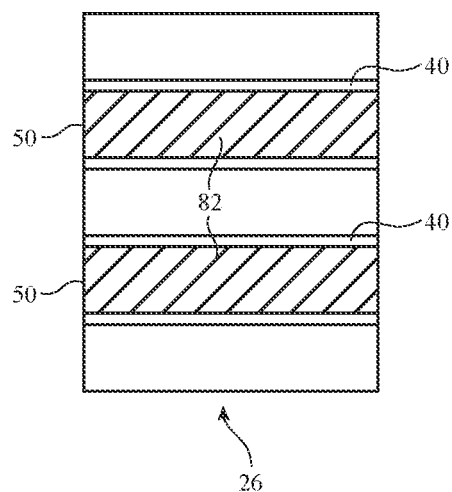
FIG. 9 is a bottom view of an illustrative electrical component having contact pads that span the length of width of the electrical component in accordance with an embodiment.
Figure 10:
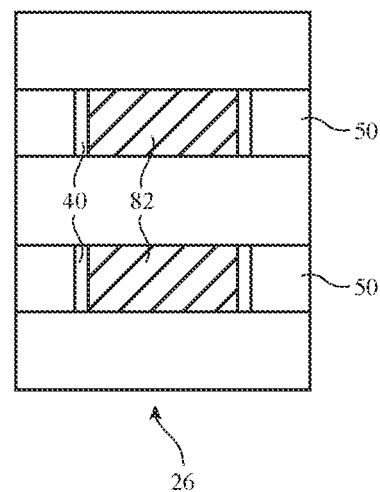
FIG. 10 is a bottom view of an illustrative electrical component having contact pads that span less than the full width of the electrical component in accordance with an embodiment.

Each strand 80C may align with an associated pad 40 on component 26. If desired, pads 40 may be formed from elongated strips of conductive material (e.g., metal) that extend from one edge of interposer 36 to an opposing edge of interposer 36, as shown in the example of FIG. 9. This provides a large area with which to form a mechanical and electrical connection between interposer 36 and strands 80C. The elongated shape of pads 40 may allow conductive material 82 to attach a longer portion of strand 80C to pad 40. The connection between pad 40 and strand 80C may, for example, span across the width of interposer 36, thereby providing a robust connection between interposer 36 and strand 80C. This is, however, merely illustrative. If desired, pads 40, conductive material 82, and the exposed conductive portions of strands 80C may span across less than all of the width of component 26, as shown in the example of FIG. 10.

Figure 11:
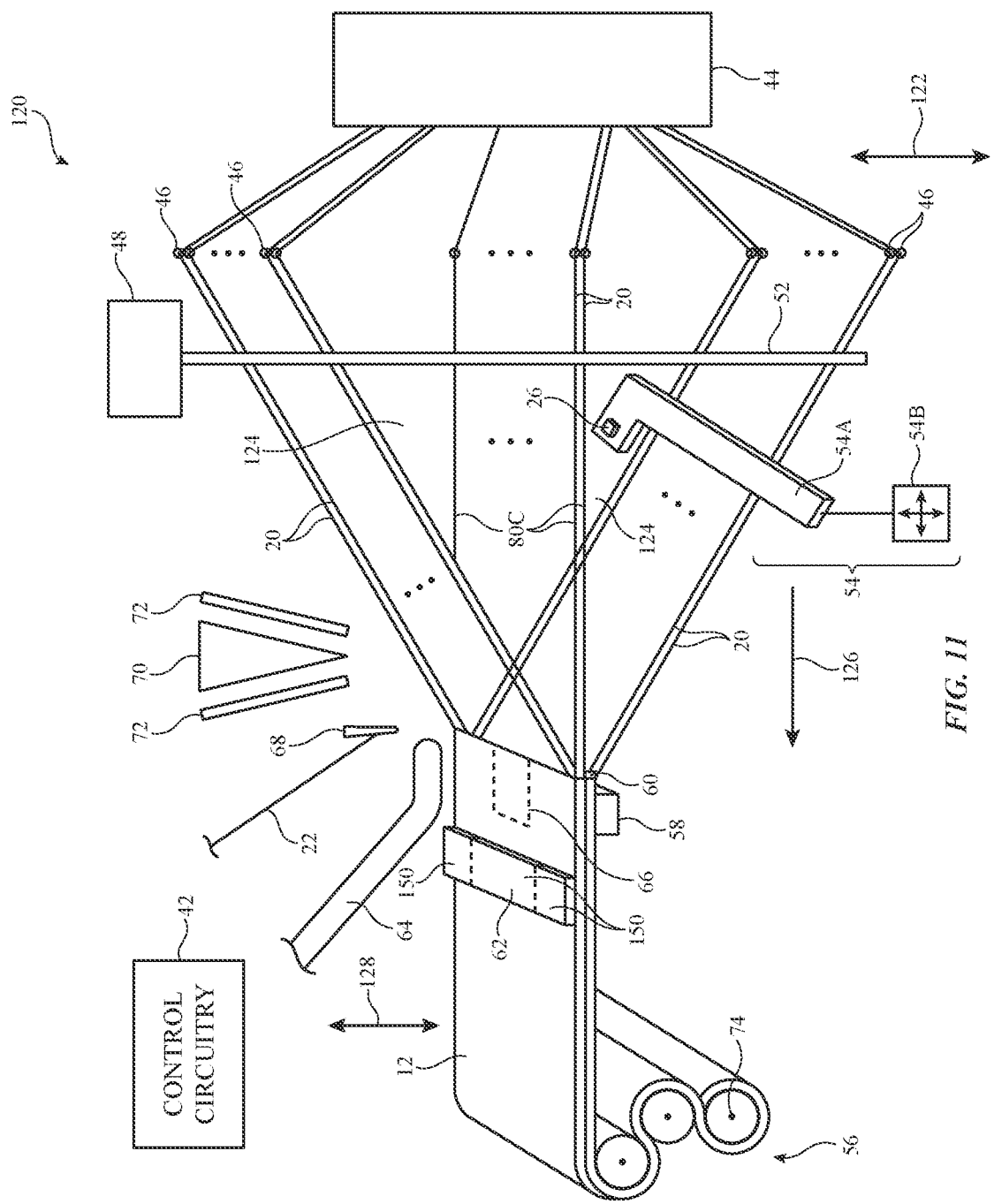
FIG. 11 is a perspective view of illustrative equipment that may be used to form fabric with electrical components in accordance with an embodiment.

Illustrative interlacing equipment is shown in FIG. 11. In the example of FIG. 11, interlacing equipment 120 includes weaving equipment for forming woven fabric.

In weaving arrangements, interlacing equipment 120 includes a warp strand source such as warp strand source 44. Source 44 may supply warp strands 20 from a warp beam, a creel, cones, bobbin, or other strand dispensing structure. Source 44 may, for example, dispense warp strands 20 through electrically controlled dispensing rollers or other warp strand dispensing and tensioning equipment (e.g., a rotating drum, electrically controlled actuators, sensors, and/or other equipment that measures, controls, and/or adjusts strand feed and tension of warp strands 20).

Control circuitry 42 may control the operation of equipment 120. Control circuitry 42 may include storage and processing circuitry for implementing control functions during weaving operations. The storage may include, for example, random-access memory, non-volatile memory such as read-only memory, hard disk storage, etc. The processing circuitry may include microprocessors, microcontrollers, digital signal processors, application-specific integrated circuits, and other circuits for executing software instructions obtained from storage.

Warp strands 20 may be positioned using warp strand positioning equipment such as heddles 46. Heddles 46 may each include an eye mounted on a wire or other support structure that extends between respective positioners (or between a positioner and an associated spring or other tensioner). In some arrangements, heddles 46 may be mechanically driven (e.g., by a dobby). In other arrangements, the positioners that move heddles 46 may be motors (e.g., stepper motors) or other electromechanical actuators that are controlled by control circuitry 42 during weaving operations so that warp strands 20 are placed in desired positions during weaving. In particular, control circuitry 42 may supply control signals that move each heddle 46 by a desired amount up or down in directions 122. By raising and lowering heddles 46 in various patterns (e.g., to different heights) in response to control signals from control circuitry 42, different patterns of sheds 124 (gaps) between warp strands 20 may be created to adjust the characteristics of the fabric produced by equipment 120.

Weft strands such as weft strand 22 may be inserted into one or more sheds 124 during weaving to form fabric 12. Weft strand positioning equipment 68 may be used to place one or more weft strands 22 between the warp strands 20 forming each shed 124. Weft strand positioning equipment 68 for equipment 120 may include one or more shuttles and/or may include shuttleless weft strand positioning equipment (e.g., needle weft strand positioning equipment, rapier weft strand positioning equipment, or other weft strand positioning equipment such as equipment based on projectiles, air or water jets, etc.). For example, weft strand positioning equipment 68 of equipment 120 may include an electrically controllable rapier weft strand device or other weft strand insertion equipment that is controlled by control circuitry 42. Weft strand positioning equipment 68 may, if desired, be controlled independently of other components in equipment 120. For example, weft strand insertion operations may be temporarily suspended with or without suspending other weaving operations.

Weft strand positioning equipment 68 may insert weft strand 22 into shed 124 across fabric 12 and may attach weft strand 22 to binder 60 on an opposing side of fabric 12 (e.g., a strand that stitches the edges of fabric 12). After each pass of weft strand 22 is made through shed 124, reed 52 (e.g., a reed member with slots or other openings through which respective warp strands 20 pass) may be moved in direction 126 by reed positioner 48 to push the weft strand 22 that has just been inserted into shed 124 between respective warp strands 20 against previously woven fabric 12, thereby ensuring that a satisfactorily tight weave is produced. Reed 52 may be moved linearly or may rotate back and forth about a shaft to approximate linear reciprocating movement. The positioner for the reed (positioner 48) may be, for example, a linear actuator that is controlled by control signals from control circuitry 42 and that moves the reed towards and away from the edge of fabric 12.

Fabric 12 that has been woven may be gathered on fabric collection equipment such as take-down rollers 56 or other take-down equipment. Rollers 56 may collect woven fabric 12 as rollers 56 rotate about respective rotational axes 74. As shown in FIG. 11, take-down equipment 56 may collect fabric 12 on multiple rollers, which may help protect electrical components in fabric 12 while maintaining an appropriate amount of tension in fabric 12. For example, less tension may be applied to portions of fabric 12 where electrical component 26 is located, while other portions of fabric 12 that do not include electrical components may be held under a higher amount of tension.

Equipment 120 may include a hold-down bar such as hold-down bar 62 for applying pressure to woven fabric 12 before fabric 12 is gathered on take-down equipment 56. To ensure that electrical components 26 in fabric 12 are not damaged by hold-down bar 62, hold-down bar 62 may have an adjustable height. In particular, control equipment 42 may move hold-down bar 62 up and down in directions 128 to accommodate components 26. As fabric 12 moves towards take-down equipment 56 and component 26 approaches hold-down bar 62, control circuitry 42 may move hold-down bar 62 upwards (away from fabric 12) to ensure that no pressure (or only modest pressure) is applied to component 26. When component 26 is no longer beneath hold-down bar 62, control circuitry 42 may move hold-down bar 62 downwards to apply an appropriate amount of pressure to fabric 12 where components 26 are not located. If desired, the entirety of hold-down bar 62 may move in unison, or hold-down bar 62 may include individually controlled portions 150 (e.g., actively controlled portions, spring-loaded portions, etc.) that may be individually and independently moved along directions 128. In arrangements where hold-down bar 62 includes individually controlled portions 150, some portions 150 may remain on the surface of fabric 12 while other portions (e.g., portions that align with component 26) may be temporarily lifted to accommodate components 26 as fabric 12 is woven.

Warp strand dispensing and tensioning equipment 44, heddles 46, reed 52 (including positioner 48), weft strand insertion equipment 68, hold-down bar 62, and take-down (take-off) equipment such as rollers 56 may each be independently controlled by control circuitry 42. At the same time, and in coordination with the control of these components, control circuitry 42 may control component insertion and strand processing equipment in equipment 120 (e.g., so that light-emitting diodes, integrated circuits, sensors, and other electrical components such as component 26 can be inserted into fabric 12).

For example, control circuitry 42 may temporarily suspend weaving operations (e.g., may temporarily suspend movement of weaving components such as warp strand dispensing and tensioning equipment 44, heddles 46, reed 52, weft strand insertion equipment 68, hold-down bar 62, and take-down equipment 56) while electrically controlled strand processing equipment performs processing operations on strands 20 and/or 22 and/or while component insertion equipment inserts electrical components into fabric 12 (e.g., by soldering contacts on electrical components to conductive strands 20 and/or 22).

Strand processing equipment may include insulation removal tool 70 and heating tool 64. Insulation removal tool 70 may include lasers, heating elements, and/or other components that generate light, heat, and/or other energy for removing insulation from the exterior of insulated conductive strands 80C. Heating tool 64 may include an inductive head, heating elements, a hot air source, lasers, and/or other components that generate heat and/or other energy for melting solder and/or melting encapsulant material on components 26. For example, solder 82 (FIG. 8) may be reflowed on contacts 40 to thereby solder component 26 to conductive strands 80C. Encapsulant material such as portions of protective structure 130 may also be melted using heating tool 64 to form a robust mechanical connection and provide encapsulation around the electrical connection. If desired, equipment 120 may include other strand processing equipment such as components for applying coatings and/or other equipment for modifying strands 20 and/or strands 22. If desired, heating elements may be incorporated into other components in equipment 120 such as hold-down bar 62 and/or support structure 58.

If desired, insulation may be removed from strands, solder may be reflowed, and encapsulant material may be melted using a single tool (e.g., a laser and/or heating element may be used to remove insulation, reflow solder, and melt encapsulant material at the same time and/or at different times). Arrangements where a first tool such as insulation removal tool 70 (e.g., a laser) is used to remove insulation from strands 20 and/or 22 and a second tool such as heating tool 64 (e.g., an inductive heating tool, hot air, laser, etc.) is used to reflow solder and melt encapsulant material are sometimes described herein as an illustrative example. If desired, one or more sensors such as pyrometer 72 may be used to monitor the temperature of component 26, fabric 12, and/or other components during insulation removal operations, during solder reflow operations, and/or during the melting of encapsulant material. Support structures that are not susceptible to inductive heating such support structure 58 (e.g., a block of dielectric material such as ceramic, plastic, etc.) may be used to provide support under fabric 12 where component 26 will be mounted. If desired, conductive strands in fabric 12 such as conductive strands 80C may include non-insulated conductive strands (e.g., strands that do not include an outer insulator) and insulation removal tool 70 may not be needed.

Component insertion equipment for inserting components into fabric 12 during the formation of fabric 12 may include insertion tool 54. Insertion tool 54 may include an insertion head 54A and an electrically controlled positioner 54B that positions the insertion head within shed 124. Insertion tool 54 may be used to insert components 26 (e.g., electrical components) into fabric 12. For example, insertion tool 54 may place component 26 in shed 124, may align grooves 50 in component 26 with conductive strands 80C, and may slide component 26 along conductive strands 80C into a void in fabric 12 such as pocket 66 so that the exposed conductive segments of conductive strands 80C in pocket 66 are received within grooves 50 and aligned with pads 40 of component 26. In other arrangements, insertion tool 54 may align component 26 with segments of strands 80C that are initially located outside of pocket 66. In this type of scenario, component 26 may be aligned with strands 80C, electrically connected (e.g., soldered) to strands 80C, and encapsulated (if desired) before component 26 is inserted into pocket 66. If desired, equipment 120 may include a spreading tool for spreading warp strands to create a shed opening through which component 26 may be accessed for out-of-pocket processing of component 26. This type of out-of-pocket processing is described in more detail in connection with FIGS. 29-34.

If desired, fabric 12 may have multiple pockets 66 for multiple components 26 and/or may have multiple components 26 in each pocket 66. If desired, components 26 may be mounted to portions of fabric 12 other than pockets 66 during the formation of fabric 12 (e.g., may be mounted to an upper or lower surface of fabric 12 and/or to other portions of fabric 12). Pockets 66 may be staggered with respect to one another or formed in one line. Multiple components 26 in one pocket 66 may be staggered with respect to one another or formed in one line. If desired, multiple components 26 may be electrically connected to the same pair of conductive strands and/or a component may have a first terminal coupled to one portion of a strand and a second terminal coupled to a second portion of the same strand. Pocket 66 may be entirely opaque, may be entirely transparent, or may have both opaque and transparent regions. Transparent portions of pocket 66 may allow light emitted from one or more devices 28 to be transmitted through fabric 12 and/or may allow external light to reach (and be detected by) one or more devices 28.

Insertion tool 54 may include one or more components for mounting electrical components 26 in fabric 12. For example, insertion tool 54 may include an electrically controlled actuator for regulating the release of components 26 from insertion tool 54 (e.g., when component 26 is in pocket 66), may include sensors for monitoring the positions of strands 20 and/or strands 22, sensors for monitoring the positions of components 26, sensors for measuring temperature, sensors for measuring resistance, or other devices for gathering input and/or data on the environment surrounding insertion tool 54.

Figure 12:
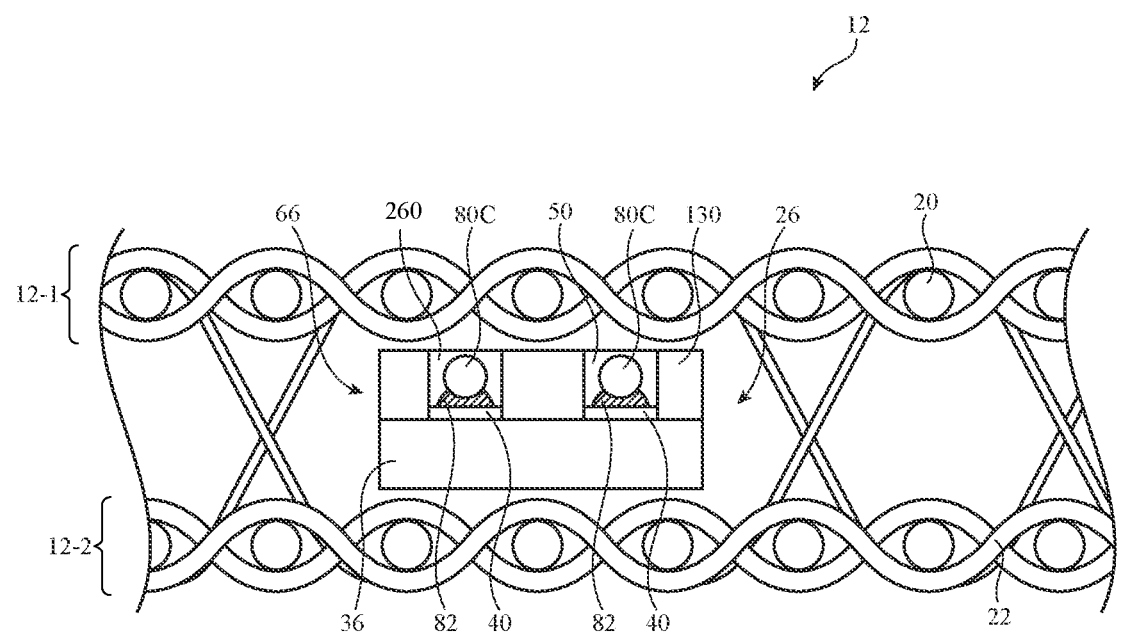
FIG. 12 is a cross-sectional side view of illustrative fabric with an electrical component in accordance with an embodiment.

FIG. 12 is a cross-sectional side view of fabric 12 showing how component 26 may be mounted in pocket 66 of fabric 12. As shown in FIG. 12, pocket 66 may be formed from a gap between fabric portion 12-1 and fabric portion 12-2. Component 26 may be located in pocket 66 and may be attached to conductive strands 80C in pocket 66. Encapsulant material 260 (e.g., thermoplastic, epoxy, polyamide, polyurethane, silicone, other suitable materials, or a combination of any two or more of these materials) may encapsulate the solder connection between component 26 and conductive strands 80C. Encapsulant material 260 may be a part of protective structure 130 (FIG. 8) that is melted to cover the solder connection in each groove 50 (e.g., as described in connection with FIGS. 26 and 27), or encapsulant material 260 may be a separate encapsulant material that is dispensed in each groove 50 (e.g., as described in connection with FIG. 31). In some arrangements, encapsulant material 260 may be formed from a dual-phase solder material (e.g., a solder material that releases encapsulation material during the soldering process). If desired, component 26 may include both encapsulant that is dispensed in grooves 50 (e.g., on an upper and/or lower side of component 26) as well as thermoplastic that is melted (e.g., on an upper and/or lower side of component 26) to help secure component 26 to fabric 12.

Warp strands 20 and weft strands 22 may overlap the opposing upper and lower surfaces of component 26 in pocket 66. If desired, there may be a greater or fewer number of strands 20 and 22 in fabric portions 12-1 and 12-2 than shown in FIG. 12. The example of FIG. 12 is merely illustrative. In some arrangements, the gap between first and second fabric portions 12-1 and 12-2 may remain in place after electrical component 26 is enclosed in fabric 12 (e.g., a space may exist between fabric portions 12-1 and 12-2 after formation of fabric 12 is complete, as shown in the example of FIG. 12). In other arrangements, first and second fabric portions 12-1 and 12-2 may be pulled together such that gap 66 is eliminated after electrical component 26 is enclosed in the gap (e.g., fabric portions 12-1 and 12-2 may be in contact with one another without an intervening gap after the formation of fabric 12 is complete). Fabric 12 may have a bulge where electrical component 26 is located (as shown in the example of FIG. 12), or fabric 12 may not have a bulge where electrical component 26 is located (e.g., the fabric may have substantially uniform thickness across locations with electrical components 26 and locations without electrical components 26, if desired).

The examples of FIGS. 11 and 12 in which component 26 is inserted into a woven fabric are merely illustrative. If desired, component 26 may be inserted into fabric that is knit using knitting equipment. An illustrative knitting system for knitting fabric 12 is shown in FIG. 13.

Figure 13:
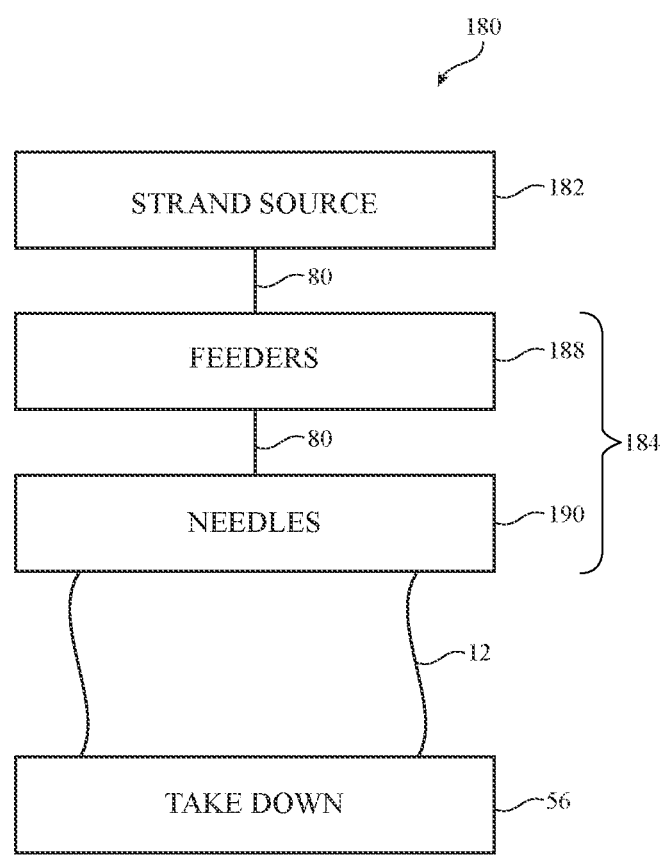
FIG. 13 is a diagram of an illustrative knitting system in accordance with an embodiment.

As shown in FIG. 13, interlacing equipment 120 for knitting arrangements may include a strand source such as strand source 182. Strand source 182 may include a creel with spools of strands 80. Knitting elements 184 may be used to knit strands 80 into knitted fabric 12. Knitted fabric 12 may be gathered on drums or other take-down equipment 56. If desired, take-down equipment 56 may have multiple independently-controlled rollers similar to take-down equipment 56 of FIG. 11.

Knitting elements 184 may include strand guide structures such as feeders 188 that guide strands 80 towards needles and other equipment 190. Equipment 190 may include latch needles or needles of other types. In some arrangements, equipment 190 may include multiple beds of needles such as a front needle bed and a back needle bed. Equipment 190 may include strand positioning structures that move strands 80 from one needle bed to another needle bed. Equipment 190 may also include hooks or other cam structures and other structures for manipulating the positions of needles. The needles, feeders, and other knitting elements 184 may be implemented as separately adjustable components or the functionality of two or more of these tools may be combined in equipment 184.

Figure 14:
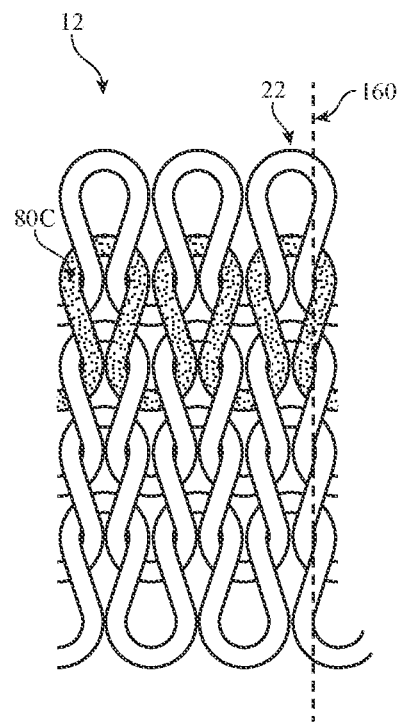
FIG. 14 is a front view of an illustrative weft knit fabric having conductive strands in accordance with an embodiment.

In some arrangements, interlacing equipment 120 of FIG. 13 may be used to form weft knit fabric 12 of the type shown in FIG. 14. As shown in FIG. 14, weft knit fabric 12 may be formed from weft strands 22 that form rows of loops extending across the width of the fabric. The rows of loops may be interlaced with one another to form weft knit fabric 12. Conductive strands 80C may be incorporated into weft knit fabric 12 of FIG. 14.

Figure 15:
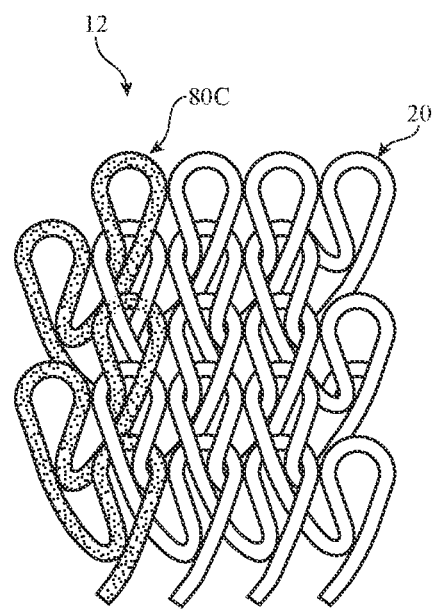
FIG. 15 is a front view of an illustrative warp knit fabric having conductive strands in accordance with an embodiment.

In some arrangements, interlacing equipment 120 of FIG. 13 may be used to form warp knit fabric 12 of the type shown in FIG. 15. In a warp knit fabric, warp strands 20 form columns of loops that zig-zag along the length of the fabric. The columns of loops are interlaced with one another to form warp knit fabric 12. Conductive strands 80C may be incorporated into warp knit fabric 12 of FIG. 15.

Figure 16:
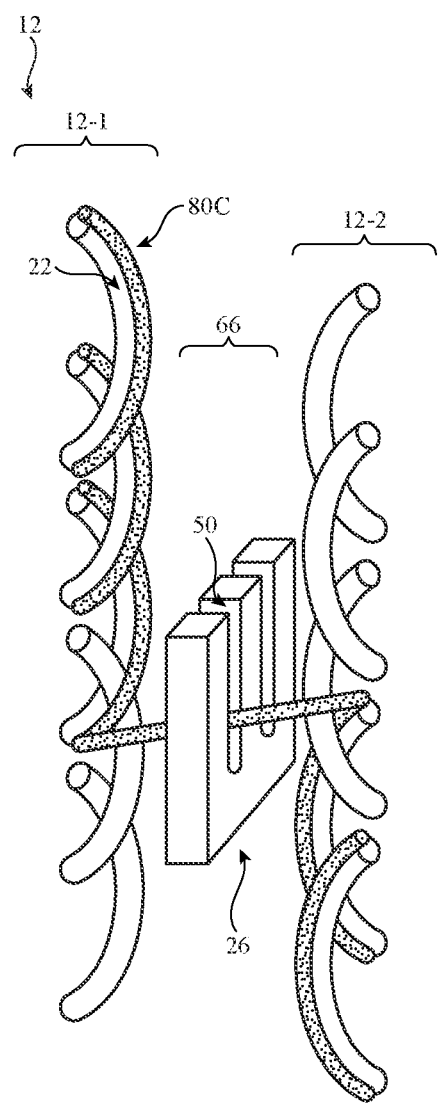
FIG. 16 is a perspective view of an illustrative electrical component being inserted from below onto a conductive strand in a knit fabric during formation of the fabric in accordance with an embodiment.

FIG. 16 shows how component 26 may be mounted to conductive strands 80C during the knitting process. Interlacing equipment 120 of FIG. 13 may be used to form gap 66 between first and second fabric portions 12-1 and 12-2. Fabric portions 12-1 and 12-2 may be different portions of a single knit fabric layer or fabric portions 12-1 and 12-2 may be located in separate knit fabric layers. In the diagram of FIG. 16, fabric portions 12-1 and 12-2 are each represented using a single set of loops (e.g., a cross-section of the loops extending along line 160 of FIG. 14). It should be understood, however, that fabric portions 12-1 and 12-2 may be formed from multiple rows or columns of loops that are interlaced to form weft knit fabric of the type shown in FIG. 14 or warp knit fabric of the type shown in FIG. 15. For example, a first needle bed may be used to interlace the loops of fabric portion 12-1, and a second needle bed may be used to interlace loops of fabric portion 12-2. Gap 66 may, if desired, be located between the two needle beds.

As shown in FIG. 16, one or more conductive strands such as conductive strand 80C is located in gap 66. Insertion tool 54 may be used to insert component 26 into gap 66 and onto conductive strands 80C. Insertion tool 54 may align grooves 50 on component 26 with conductive strands 80C.

If desired, strand processing equipment such as insulation removal tool 70 and heating tool 64 of FIG. 11 may be used to process strands 80 during the knitting process. For example, insulation removal tool 70 may be used to remove insulation from the exterior of insulated conductive strands 80C during the knitting process. Heating tool 64 may be used to melt solder and/or melting encapsulant material on components 26 during the knitting process. For example, solder 82 (FIG. 8) may be reflowed on contacts 40 to thereby solder component 26 to conductive strands 80C. Encapsulant material such as portions of protective structure 130 (FIG. 8) may also be melted using heating tool 64 to form a robust mechanical connection and provide encapsulation around the electrical connection.

Figure 17:
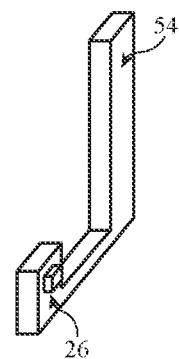
FIG. 17 is a perspective view of an illustrative insertion tool that may be used to insert electrical components into fabric in accordance with an embodiment.

FIG. 17 is a perspective view of an illustrative insertion tool 54 which may be used to insert component 26 into gap 66 of fabric 12 while fabric 12 is being knitted using interlacing equipment 120 of FIG. 13. If desired, insertion tool 54 may have a vertically extending body with a slim profile so that insertion tool 54 can slide component 26 into gap 66 of FIG. 16.

Figure 18:
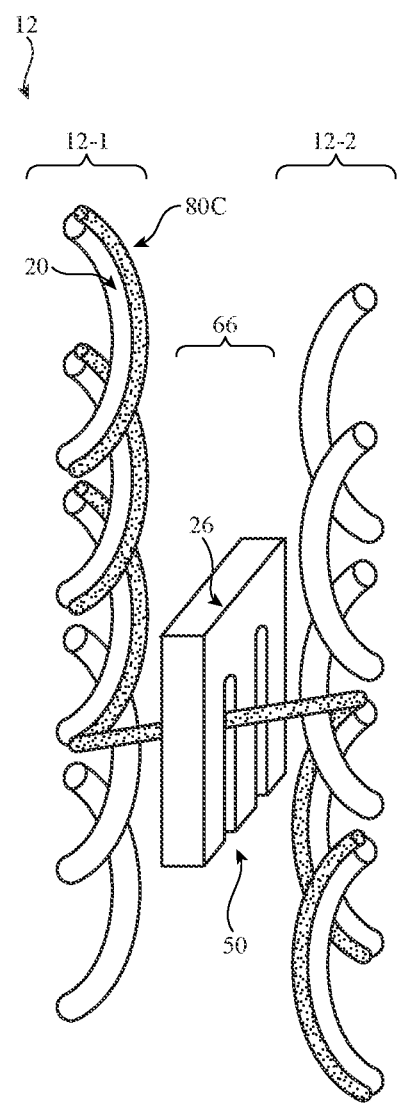
FIG. 18 is a perspective view of an illustrative electrical component being inserted from above onto a conductive strand in a knit fabric during formation of the fabric in accordance with an embodiment.

The example of FIG. 16 in which grooves 50 are located on an upper surface of component 26 so that component 26 can be inserted from below conductive strand 80C in gap 66 is merely illustrative. If desired, grooves 50 may be located in a lower surface of component 26 so that component 26 can be inserted from above conductive strand 80C, as shown in the example of FIG. 18.

Figure 19:
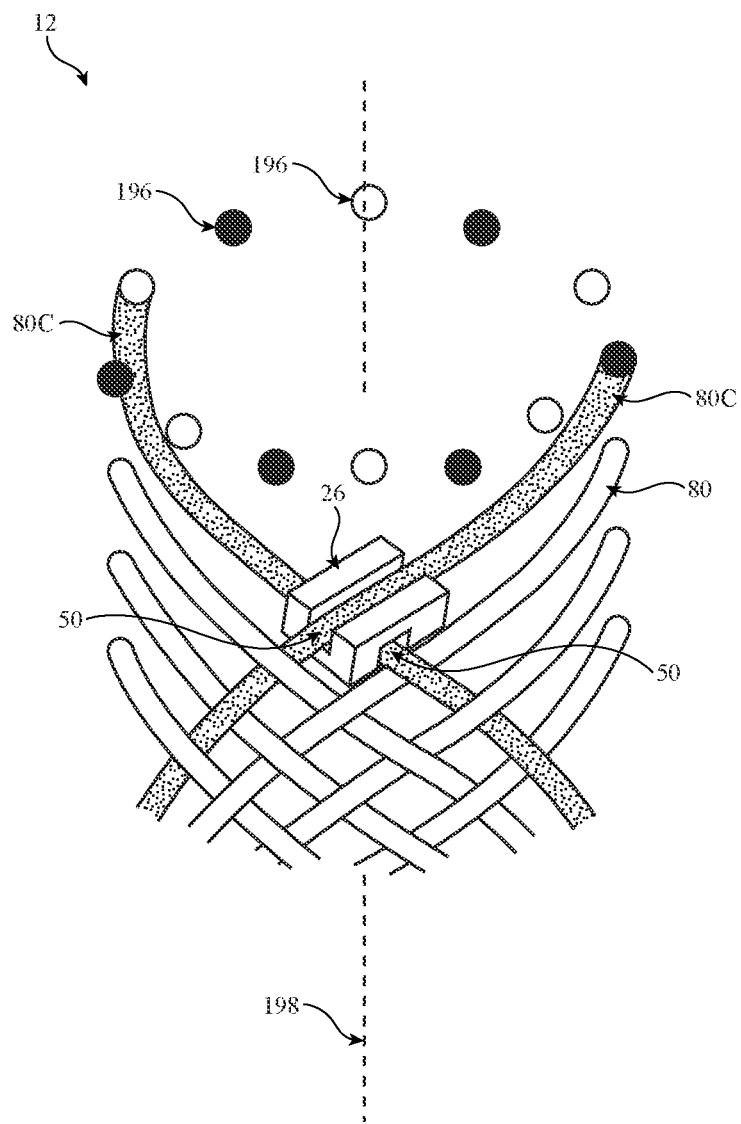
FIG. 19 is a perspective view of an illustrative electrical component being inserted onto a conductive strand in a braided fabric during formation of the fabric in accordance with an embodiment.

FIG. 19 is a diagram illustrating how component 26 may be inserted into a braided fabric during the formation of the braided fabric. As shown in FIG. 19, interlacing equipment 120 in braiding arrangements may include guide bars 196 that are used to braid strands 80. Conductive strands 80C may be incorporated into braided fabric 12. To account for the braided structure of fabric 12, component 26 may have a first groove 50 in an upper surface and a second groove 50 in a lower surface. If desired, grooves 50 may be oriented along different directions to receive strands 80C that are oriented along different directions in fabric 12. For example, upper and lower grooves 50 may be perpendicular to one another, oriented at 45 degrees with respect to one another, oriented at 30 degrees with respect to one another, or oriented at any other suitable angle with respect to one another.

FIG. 20 is a cross-sectional side view of an illustrative conductive strand 80C that may be used in fabric 12. As shown in FIG. 20, conductive strand 80 may have a conductive core 88 surrounded by an insulating coating 90. In arrangements where tool 70 of FIG. 11 is a laser, tool 70 may emit light 86 (e.g., ultraviolet light, visible light, and/or infrared light). Light 86 may, for example, have a wavelength that is absorbed by insulating coating 90 and not absorbed by conductive core 88. Light 86 may be emitted continuously (e.g., using a continuous wave laser) or may be emitted in pulses (e.g., to perform laser ablation operations). Tool 70 may emit laser pulses having durations of $10^{-15}$-$10^{-12}$ seconds, $10^{-15}$-$10^{-9}$ seconds, longer than on picosecond, shorter than one picosecond, longer than one nanosecond, shorter than one nanosecond, between one femtosecond and one millisecond, or other suitable durations. Short pulses may have high energy densities and may be suitable for ablating (vaporizing) polymers and other materials without melting nearby structures. Short pulses, longer duration pulses, and/or continuous wave light beams may be used in softening and/or melting polymers and other materials.

A computer-controlled positioner may be used to adjust the position of laser 70 and thereby adjust the position of laser beam 86 relative to strand 80C. If desired, ancillary beam steering structures such as adjustable mirror 92 may be used to adjust the position of laser beam 86. As shown in FIG. 20, some laser light 86 may be aimed directly at strand 80C to remove a portion of insulating coating 90, whereas other laser light 86 may be aimed at mirror 92 to remove another portion of insulating coating 90. This may ensure that all or nearly all of insulating coating 90 around the circumference of strand 80C is removed from the desired portion of conductive strand 80C. This is, however, merely illustrative. If desired, strand 80C may be rotated during laser ablation operations to ensure that insulating coating 90 is removed from the desired portions of conductive strand 80C.

Once insulating coating 90 has been removed from a desired portion of strand 80C, conductive core 88 may be exposed, as shown in FIG. 21. If desired, insulating coating 90 may be removed only from a portion of strand 80C while insulating coating 90 remains on other portions of strand 80C, as shown in FIG. 22. This creates exposed conductive segments 84 on strands 80C while the remaining portions of strands 80C remain insulated.

Figure 23:
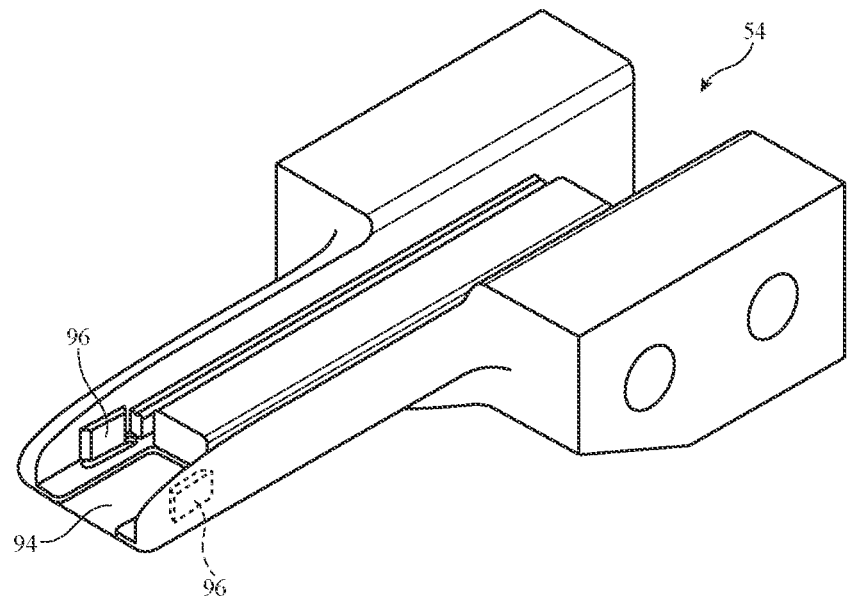
FIG. 23 is a perspective view of an illustrative insertion tool that may be used to insert electrical components into fabric in accordance with an embodiment.

FIG. 23 is a perspective view of an illustrative insertion tool 54. Insertion tool 54 may be formed from an insulating material (e.g., ceramic, plastic, or other suitable insulating material) so as not to become heated during induction heating operations. In other arrangements, insertion tool 54 may be used as a heating tool itself and may include a heating element that produces heat or a metal element such as a metal coil that becomes heated during induction heating operations. If desired, tool 54 may be compatible with interchangeable tool heads. For example, different insertion tool heads may be attached to tool 54 (e.g., for components 26 of different types, size, shape, number, etc.) and/or heads that perform other functions (e.g., heating tool heads, machining tool heads, cutting tool heads, laser tool heads, a head containing a mirror such as mirror 92 of FIG. 20 for use with laser 70, etc.) may be attached to the end of tool 54.

As shown in FIG. 23, insertion tool 54 may include an end portion 94 for holding component 26 as component 26 is inserted into fabric 12 during weaving operations. If desired, a pick-and-place tool may be used to place one or more components 26 onto end portion 94 of tool 54. Releasable engagement structures such as engagement structures 96 may hold component 26 in place until it is desired to release component 26 from insertion tool 54. Engagement structures 96 may be friction tabs that flex in and out to hold and release component 26. This is, however, merely illustrative. If desired, other suitable engagement structures may be used to hold component 26 in place on tool 54 and to release component 26 from tool 54.

Figure 24:
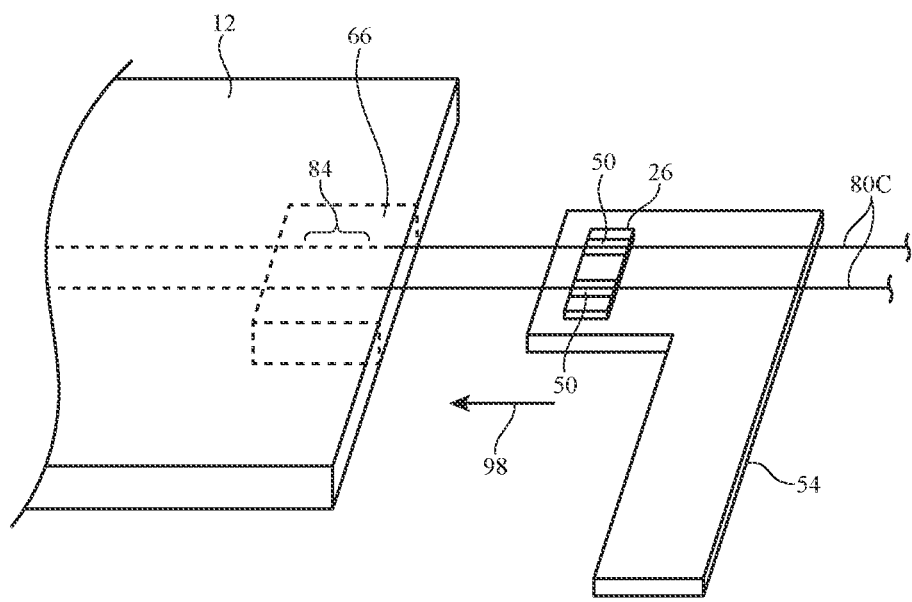
FIG. 24 is a perspective view of an illustrative insertion tool being used to align an electrical component with conductive strands during fabric formation in accordance with an embodiment.

FIG. 24 is a perspective view of insertion tool 54 being used to insert component 26 into fabric 12. As shown in FIG. 24, insertion tool 54 may hold component 26 on an upper surface as insertion tool 54 moves into ss 124 (FIG. 11). Once in shed 124, insertion tool 54 may align component 26 with conductive strands 80C. In particular, insertion tool 54 may align conductive strands 80C with grooves 50 in component 26. If desired, conductive strands 80C may initially be positioned to hover within grooves 50 to avoid contact with solder paste 82 in grooves 50 until component 26 is in pocket 66. Such positioning may be achieved by raising conductive strands 80C (e.g., with peddles 46) and/or using insertion tool 54 to maintain a small gap between solder 82 and strands 80C until component 26 has reached the appropriate position in pocket 66.

Once conductive strands 80C are aligned with grooves 50 in component 26, insertion tool 54 may move component 26 in direction 98 while sliding component 26 along strands 80C until component 26 has reached the appropriate position in pocket 66. In particular, insertion tool 54 may continue in direction 98 until pads 40 on component 26 are appropriately aligned with exposed conductive segments 84 of strands 80C, as shown in FIG. 25.

Once component 26 has reached the appropriate position in pocket 66, heating tool 64 may be used to reflow solder 82 and, if desired, melt protective structure 130 on component 26. As shown in FIG. 25, inductive heating tool 64 may locally heat solder 82 and/or protective structure 130 (FIG. 8) to thereby reflow solder 82 and melt protective structure 130. This creates a robust electrical and mechanical connection between component 26 and strands 80C.

Figure 26:
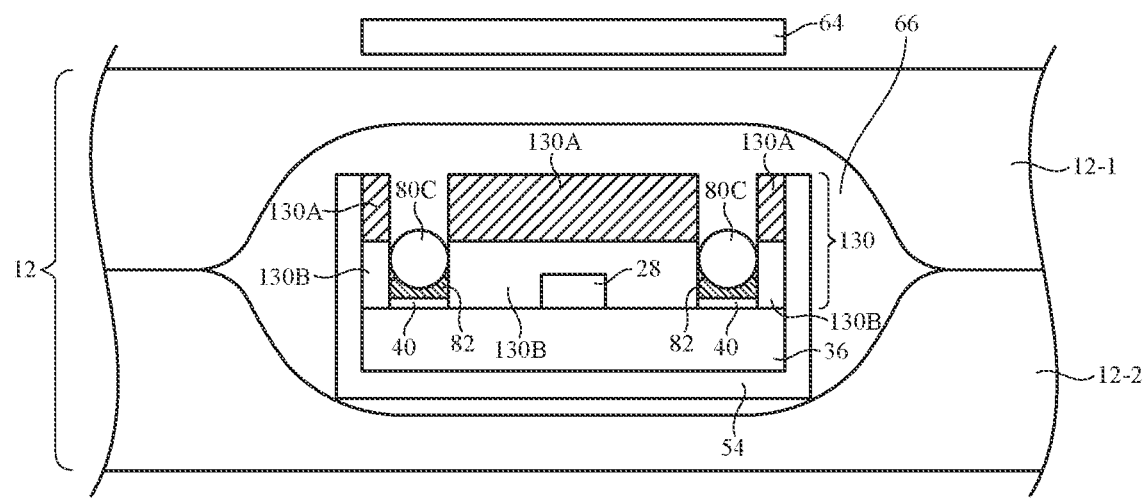
FIG. 26 is a cross-sectional side view of an electrical component being held in a fabric pocket by an insertion tool while a heating tool is used to melt solder and an encapsulant material in accordance with an embodiment.

FIG. 26 is a cross-sectional side view of fabric 12 showing how insertion tool 54 may hold component 26 in pocket 66 during heating operations. Interlacing equipment 120 (e.g., weaving equipment of FIG. 11, knitting equipment of FIG. 13, braiding equipment of FIG. 19, or other suitable interlacing equipment) may form pocket 66 by creating a space between two or more portions of fabric 12 (e.g., between upper fabric portion 12-1 and lower fabric portion 12-2). Pocket 66 may help orient component 26 so that solder pads 40 (and solder 82 on pads 40) are aligned with respective conductive strands 80C. During operation of item 10, conductive strands 80C may carry signals between component 26 and other circuitry in item 10.

As shown in FIG. 26, protective structure 130 may include different materials such as material 130A and material 130B. Grooves 50 may extend through both material 130A and material 130B. Material 130B may, if desired, be formed from thermoplastic having a higher melting temperature than material 130A so that only material 130A melts during heating operations. Upon heating using tool 64, solder 82 may reflow to form a mechanical and electrical connection between conductive strands 80C and component 26. Material 130A may cover the upper portions of strands 80C. After reflowing solder 82 and melting material 130A, insertion tool 54 may release component 26 and may be moved out of pocket 66. This is, however, merely illustrative. If desired, encapsulant material such as protective structure 130 may be omitted or may be melted using a different tool and/or during a different step (e.g., before or after solder reflow operations).

Figure 27:
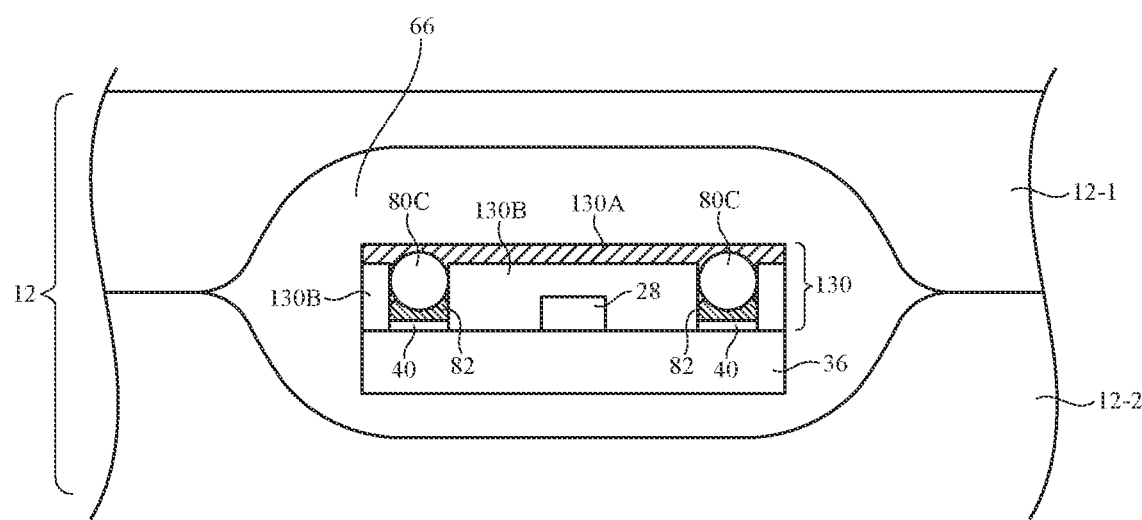
FIG. 27 is a cross-sectional side view of an electrical component that has been soldered to conductive strands in a fabric pocket in accordance with an embodiment.

As shown in FIG. 27, material 130A may fill in gaps surrounding strands 80C and within grooves 50, thereby forming a robust mechanical connection while also forming an encapsulation layer that protects the electrical connection from moisture and other contaminants.

In the example of FIG. 27, pocket 66 is shown as a gap separating fabric portions 12-1 and 12-2. This is, however, merely illustrative. If desired, first and second fabric portions 12-1 and 12-2 may be pulled together such that gap 66 is eliminated after electrical component 26 is inserted. Fabric 12 may have a bulge where electrical component 26 is located, or fabric 12 may not have a bulge where electrical component 26 is located (e.g., the fabric may have substantially uniform thickness across locations with electrical components 26 and locations without electrical components 26, as shown in the example of FIG. 27).

Figure 28:
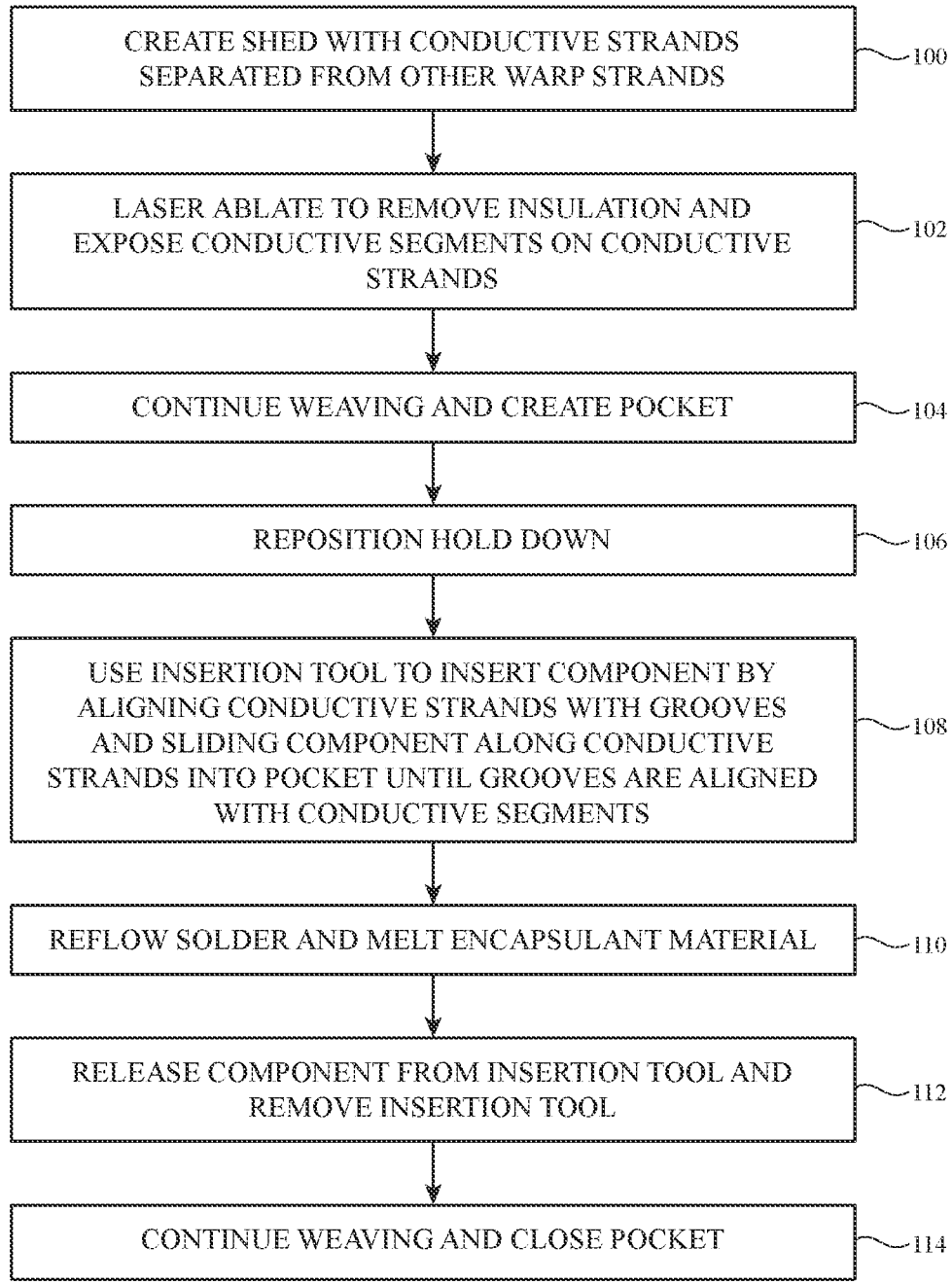
FIG. 28 is a flow chart of illustrative steps involved in using equipment to incorporate electrical components into fabric in accordance with an embodiment.

Illustrative operations involved in inserting electrical components into fabric during the formation of the fabric are shown in FIG. 28. In FIG. 28, steps for inserting electrical components into a woven fabric are shown as an illustrative example. However, it should be understood that similar methods, steps, and operations may be used to insert electrical components into a knit fabric, braided fabric, or other suitable fabric during formation of the fabric.

During the operations of step 100, control circuitry 42 may position heddles 46 so as to isolate a desired set of conductive strands 80C (e.g., wires) from other warp strands 20 in preparation for insulation removal. Conductive strands 80C may be separated from other warp strands 20 by creating sheds 124 above and below strands 80C or by creating a single shed 124 below or above strands 80C.

At step 102, insulation removal tool 70 may be used to remove insulation from the appropriate portions of conductive strands 80C. This may include, for example, positioning mirror 92 (FIG. 20) and laser 70 relative to strands 80C and laser ablating coating 90 to expose conductive core 88 along conductive segments 84. Control circuitry 42 may determine at which pick number to begin insulation removal operations based on the strand consumption in the fabric structure.

At step 104, control circuitry 42 may continue weaving and may begin forming one or more pockets 66 in fabric 12. This may include, for example, creating a gap between upper and lower fabric layers. Control circuitry 42 may synchronize the timing at which pocket 66 is formed with respect to the position of conductive segments 84 so that conductive segments 84 are properly received within pocket 66 when pocket 66 is formed.

At step 106, control circuitry 42 may reposition one or more components in equipment 120 in preparation for component insertion. This may include, for example, repositioning hold-down bar 62. The entirety of hold-down bar 62 may be lifted away from fabric 12 or one or more individual portions 150 of hold-down bar 62 may be lifted in preparation for an approaching electrical component 26. If desired, other components of equipment 120 may be repositioned (e.g., weft insertion and positioning equipment 68, reed 52, and/or other components in component 120 may be moved out of the way in preparation for component insertion).

At step 108, insertion tool 54 may be used to insert component 26 into pocket 66. During the insertion operations of step 108, one or more components of the interlacing equipment may be repositioned or paused, or the interlacing equipment may continue interlacing operations without any change. Control circuitry 42 may position heddles 46 so as to isolate a conductive strands 80C from other warp strands 20 in preparation for insulation removal. A first shed 124 may be created above strands 80C and a second shed 124 may be created below strands 80C, or a single shed 124 may be located below or above strands 80C. The location of the shed that component 26 is inserted into may be based on which side of component 26 will be attached to conductive strands 80C. If an upper surface of component 26 is going to be attached to strands 80C, then component 26 may be inserted into a shed 124 below strands 80C (as shown in FIG. 11, for example). If a lower surface of component 26 is going to be attached to strands 80C, then component 26 may be inserted into a shed 124 above strands 80C.

Insertion tool 54 may move into shed 124 and may align conductive strands 80C with grooves 50 in component 26. Insertion tool 54 may then slide component 26 along strands 80C into pocket 66 until conductive segments 84 are positioned above solder 82 in grooves 50. Control circuitry 42 may determine when to stop moving insertion tool 54 based on the amount of time that has passed since laser ablating strands 80C.

At step 110, a heating tool such as inductive heating tool 64 may be used to inductively heat and reflow solder 82. If desired, heating tool 64 may also be used to heat protective structure 130 (e.g., portion 130A of protective cover 130), thereby melting some or all of protective structure 130. Solder reflow operations and encapsulant material melting operations may be performed at the same time or may be performed during separate steps. If desired, other heating techniques may be used (e.g., hot air, conduction, heat from a lamp, or other energy) to melt solder and/or encapsulant material. The use of inductive heating is merely illustrative. If desired, insertion tool 54 and/or strands 80C may vibrate during heating to enhance solder reflow and form a robust mechanical and electrical connection between component 26 and strands 80C.

At step 112, insertion tool 54 may release component 26 (e.g., by flexing tabs 96 of FIG. 23 away from component 26 and moving insertion tool 54 out of pocket 66).

At step 114, control circuitry 42 may resynchronize components in equipment 120 (e.g., by adjusting the position, speed, tension control, or other characteristics of components such as warp strand positioning equipment, the weft strand positioning equipment, the component insertion equipment, the reed, the warp tensioning equipment, the hold-down bar, the take-down equipment, the insulation removal equipment, and the heating equipment) and may resume weaving operations. This may include, for example, closing pocket 66 so that component 26 is fully enclosed within pocket 66 and lowering hold-down bar 62 to its normal position.

In some scenarios, it may be desirable to perform certain processing operations with line-of-sight access to component 26. For example, aligning component 26 with conductive strands 80C (e.g., with conductive segments 84 of strands 80C), soldering operations, encapsulation operations, electrical connection verification operations, and/or other processing operations may be performed while the electrical component is exposed or partially exposed to the exterior of the fabric.

FIGS. 29-34 show illustrative equipment and steps involved in out-of-pocket processing in which insulation removal operations, alignment operations, soldering operations, and encapsulation operations are performed before the component is inserted into the pocket, thereby allowing visual and physical access to the electrical component during these processing operations.

Figure 29:
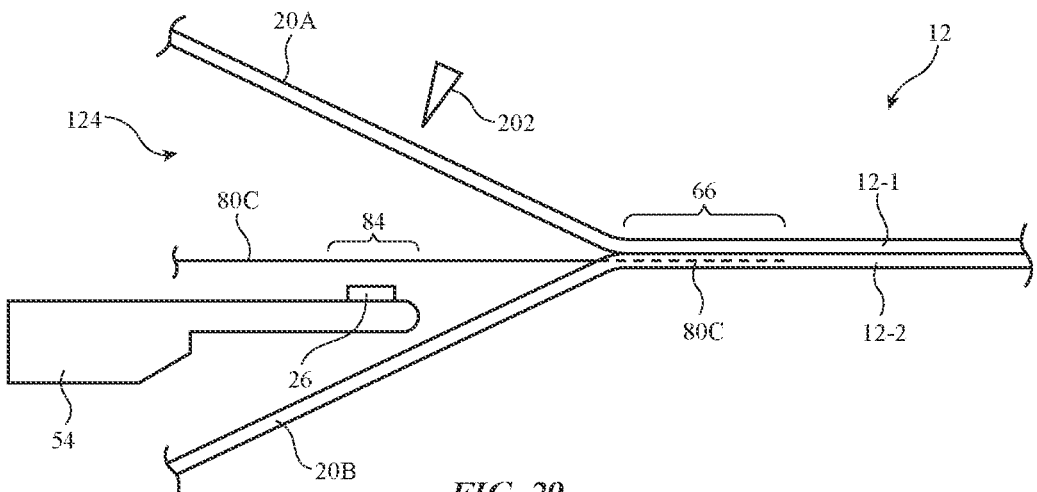
FIG. 29 is a side view showing how an insertion tool may be used to align an electrical component with conductive strands before the electrical component is inserted into a fabric pocket in accordance with an embodiment.

As shown in FIG. 29, interlacing equipment (e.g., equipment 120 of FIG. 4 and/or FIG. 11) may be used to create fabric 12 and to create pocket 66 in fabric 12. Pocket 66 may initially have an open side facing shed 124. Fabric 12 may include one or more conductive strands 80C. Conductive strands 80C may be loose in pocket 66 (e.g., not incorporated into or interlaced with fabric portions 12-1 or 12-2) or conductive strands 80C may be interlaced with upper portion 12-1 and/or lower portion 12-2 of fabric 12 in pocket 66. In the example of FIG. 29, strand 80C is incorporated into lower fabric portion 12-2.

During interlacing operations, warp strand positioning equipment may be used to position warp strands 20 to create shed 124 between upper warp strands 20A and lower warp strands 20B. The warp strand positioning equipment may position conductive strands 80C that have not yet been incorporated into fabric 12 between upper warp strands 20A and lower warp strands 20B. Strands 80C may include segments 84 where component 26 will be attached. Segments 84 may be segments from which insulation has already been removed (e.g., using a laser ablation tool that ablates the insulation and/or using a solder head that melts away the insulation) to expose conductive portions of strands 80C, or segments 84 may be insulated segments from which the outer insulation has not yet been removed.

Because segments 84 are located outside of pocket 66 when component 26 is attached, insertion tool 54 may have better access for aligning component 26 with segments 84. While warp positioning equipment positions conductive strands 80C between upper warp strands 20A and lower warp strands 20B, insertion tool 54 may hold component 26 and may align component 26 with segments 84 of conductive strands 80C. This may include, for example, aligning one or more grooves 50 on component 26 with segments 84 of strands 80C. A spreading tool such as spreading tool 202 may be used to spread upper warp strands 20A apart, thereby creating an opening in the upper portion of shed 124 through which processing equipment may access component 26. If desired, tool 202 may be used to spread apart lower warp strands 20B to create an opening in the lower portion of shed 124 (to provide access to component 26 from below). Arrangements in which tool 202 creates an opening in upper shed warp strands 20A are sometimes described herein as an illustrative example.

Figure 30:
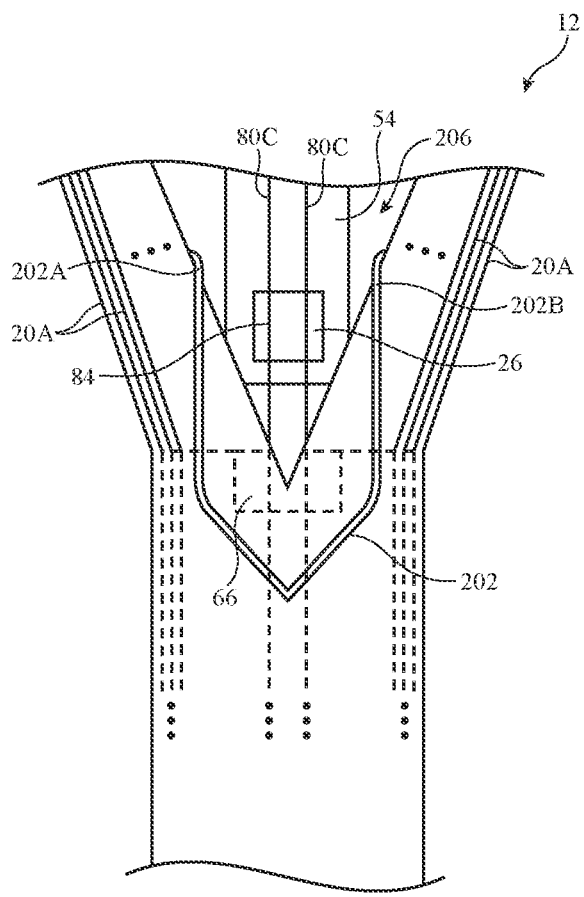
FIG. 30 is a top view of illustrative fabric showing how a spreading tool may be used to create a shed opening for providing access to an electrical component in accordance with an embodiment.

FIG. 30 is a top view of fabric 12 showing how spreading tool 202 may create an opening such as opening 206 between first and second groups of upper shed warp strands 20A. Spreading tool 202 may have a first portion such as portion 202A that holds a first group of warp strands 20A to one side and a second portion such as portion 202B that holds a second group of warp strands 20A to the other side. Spreading tool 202 may be formed from metal, plastic, or other suitable material and may include prongs and/or hooks that can pull apart strands in fabric 12. If desired, spreading tool 202 may be part of reed 52 or may be a separate component from reed 52. Spreading tool 202 may be controlled manually by an equipment operator and/or may be controlled by computer-controlled positioning equipment. Opening 206 exposes component 26 to the exterior of fabric 12. This allows line-of-sight access (e.g., to an equipment operator, to a camera, and/or to computer-controlled positioning equipment) to component 26 through opening 206. If desired, a tool such as a comb, clamp, and/or part of hold-down bar 62 may be used to hold portions of fabric 12 in place as opening 206 is formed in shed 124, thereby minimizing defects in fabric 12.

In arrangements where insulation has already been removed from segments 84, insertion tool 54 may align component 26 with the exposed conductive segments 84. In arrangements where insulation has not yet been removed from segments 84, insertion tool 54 may align component 26 with the regions of strands 80C where insulation will be removed.

Once insertion tool 54 has appropriately aligned component 26 with strands 80C (e.g., once segments 84 are received within grooves 50 of component 26) and/or once spreading tool 202 has created opening 206, additional processing steps may take place before component 26 is inserted into pocket 66. As shown in FIG. 31, equipment 212 may be used to access component 26 through opening 206 in upper shed strands 20A. Opening 206 may provide line-of-sight access of component 26 to a viewer such as viewer 208 viewing component 26 in direction 210 (or to a camera that is viewing component 26 in direction 210).

Equipment 212 may include insulation removal equipment (e.g., a solder head or other heating tool that melts insulation away, laser ablation equipment that ablates insulation away, or other equipment for removing outer insulating layers from strands 80C), electrical connection equipment (e.g., soldering tools for dispensing and/or heating solder, conductive adhesive application equipment, etc.), encapsulation tools for dispensing encapsulation, and/or may include other tools that are used to process component 26 before component 26 is inserted into pocket 66. If desired, insulation removal and soldering may be achieved using the same heat application tool (e.g., in the same processing step or in separate processing steps).

In the example of FIG. 31, equipment 212 includes solder head 216 and encapsulation material dispensing head 214. While spreading tool 202 holds warp strands 20A apart, solder head 216 may access component 26 through opening 206 and may heat solder that has been previously applied to component 26 (or may both apply and heat solder on component 26, if desired). This may include, for example, reflowing solder 82 (FIG. 8) in grooves 50 to create an electrical connection between strands 80C and component 26. Following soldering operations, encapsulant dispensing head 214 may access component 26 through opening 206 and may apply encapsulation material (e.g., encapsulation material 260 of FIG. 12) to the electrical connection between strands 80C and component 26. If desired, additional processing operations may be performed on component 26 while spreading tool 202 holds apart upper warp strands 20A. For example, the integrity of the electrical connection between component 26 and strands 80C may be verified visually and/or using measurement equipment that accesses component 26 through opening 206, if desired.

When the desired processing operations such as alignment, soldering, encapsulation, and/or electrical connection verification are completed, spreading tool 202 may be removed and insertion tool 54 may move in direction 218 to insert component 26 into pocket 66. Because component 26 is now attached to strands 80C, strands 80C may move with component 26 into pocket 66. As a result, some of strand 80C may loop back on itself as component 26 is inserted into pocket 66.

Figure 32:
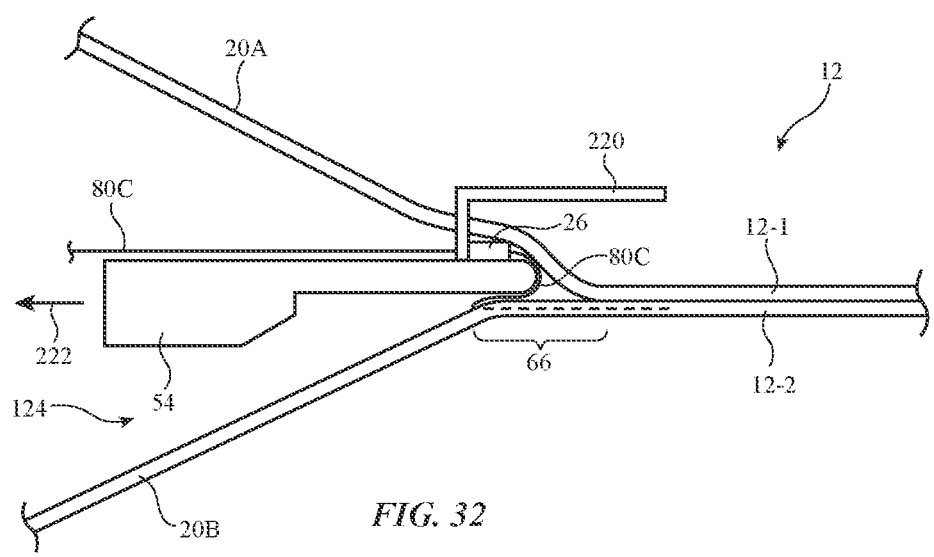
FIG. 32 is a side view showing how an insertion tool may insert an electrical component into a fabric pocket and how a retention tool may hold the electrical component in the fabric pocket while the insertion tool is removed in accordance with an embodiment.

FIG. 32 shows how a retention tool such as component retention tool 220 may hold component 26 in pocket 66 before insertion tool 54 releases component 26. In the example of FIG. 32, component retention tool 220 may have one or more small prongs that extend through fabric 12 (e.g., that extend through spaces between adjacent strands in fabric 12) to thereby hold component 26 in pocket 66. Once component 26 is retained by component retention tool 220, insertion tool 54 may release component 26 and may exit shed 124 in direction 222. In other arrangements, component retention tool 220 may be a tool that applies external pressure to fabric 12 to hold component 26 in place. For example, hold-down bar 62 may be used to apply external pressure and thereby serve as a component retention tool, or a separate tool (e.g., that travels with hold-down bar 62, if desired) may be used to apply external pressure to fabric 12 to hold component 26 in pocket 66.

Figure 33:
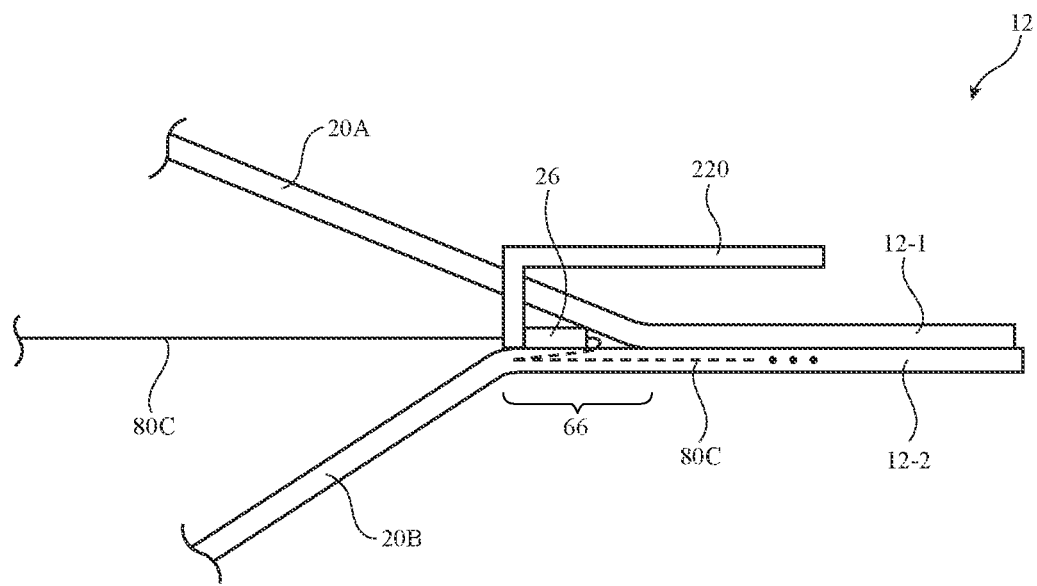
FIG. 33 is a side view showing how a retention tool may hold an electrical component in a fabric pocket while interlacing operations continue in accordance with an embodiment.

FIG. 33 shows how component retention structure 220 may remain in place after insertion tool 54 is removed so that component 26 is retained within pocket 66 while weaving operations continue and pocket 66 is closed. When pocket 66 is closed and component 26 is held within fabric pocket 66, component retention tool 220 may be removed.

Figure 34:
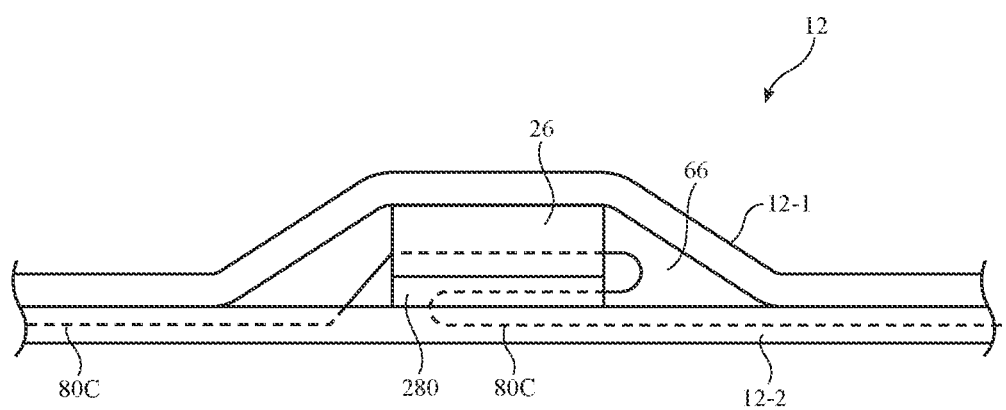
FIG. 34 is a side view of an illustrative electrical component that has been electrically coupled to conductive strands and inserted into a fabric pocket using equipment and processing operations of the type shown in FIGS. 29-33 in accordance with an embodiment.

FIG. 34 is a cross-sectional side view of component 26 in fabric 12 following the processing steps described in connection with FIGS. 29-33. As shown in FIG. 34, some of conductive strand 80C may overlap itself within pocket 66 as a result of attaching component 26 to strand 80C outside of pocket 66 and then inserting component 26 into pocket 66. If desired, additional processing steps may take place after component 26 is inserted into pocket 66 to prevent loose portions of strands 80C from becoming entangled within pocket 66. For example, encapsulant material 280 (e.g., thermoplastic) on one or more sides of component 26 (e.g., on a bottom side of component 26 facing loose portions of strands 80C) may be heated (e.g., using inductive heating techniques or other heat application equipment). The melted encapsulant 280 may capture loose portions of strands 80C in pocket 66 and may secure the bottom of component 26 to other strands in pocket 66 of fabric 12.

Figure 35:
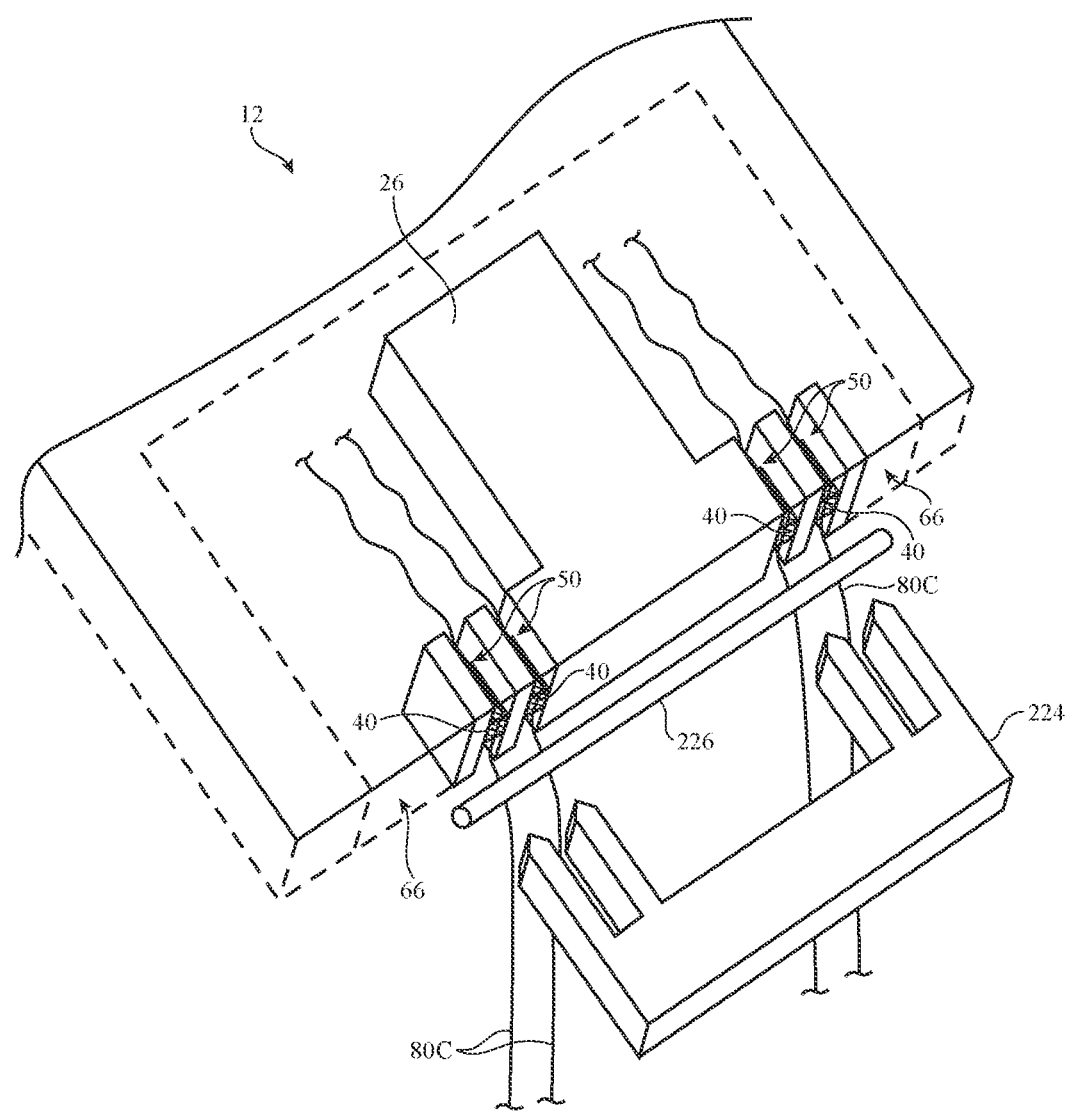
FIG. 35 is a perspective view of illustrative equipment that may be used to electrically couple an electrical component to conductive strands in a pocket by accessing the electrical component along an open side of the pocket during interlacing operations in accordance with an embodiment.

FIG. 35 shows another illustrative example in which some of the processing operations associated with attaching component 26 to fabric 12 during the formation of fabric 12 are performed with light-of-sight access to component 26. In the example of FIG. 35, component 26 is inserted into pocket 66 and is electrically connected to strands 80C while in pocket 66. To provide visual access, electrical contacts 40 of component 26 may be located on an edge portion of component 26 that is exposed along an open side of pocket 66. Component 26 may have a T-shape with first and second protruding arms. Grooves 50 may be located in the protruding arms of component 26. The T-shape may ensure that conductive strands 80C only need to extend up and over the protruding portions of component 26 rather extending up and over the entire length of component 26. This is, however, merely illustrative. If desired, component 26 may have other suitable shapes.

While component 26 is in pocket 66 and strands 80C are in grooves 50, a tool such as hot bar tool 224 may be used to reflow solder 82 (FIG. 8) on the exposed contacts 40 at the edge of pocket 66. Rod 226 may be used to hold warp strands including strands 80C away from component 26 so that hot bar 224 can easily access component 26 without strands 80C in the way. If desired, hot bar 224 may have elongated prong elements that fit within grooves 50 to help reflow solder in grooves 50. Following soldering operations, additional processing operations such as encapsulation operations and/or electrical connection verification operations may be performed while the edge of component 26 is still exposed at the edge of pocket 66. When the desired processing operations are completed, interlacing may continue and pocket 66 may be closed.

Figure 36:
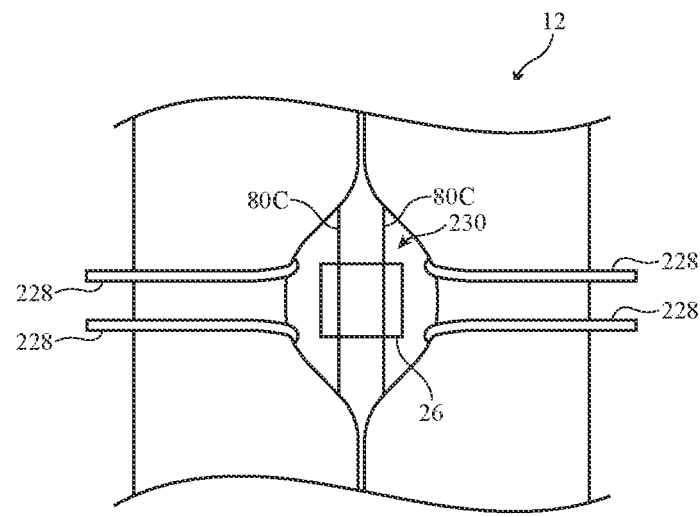
FIG. 36 is a top view of illustrative equipment that may be used to create a temporary opening in a fabric to provide access to an electrical component in the fabric in accordance with an embodiment.

FIG. 36 is a top view of another illustrative example of how processing equipment may access component 26. In the example of FIG. 36, fabric opener tool 228 is used to create opening 230 in fabric 12 by pulling strands of fabric 12 apart. Opening 230 may provide access to component 26 in pocket 66. Processing equipment such as insulation removal equipment, electrical connection (e.g., soldering) equipment, encapsulation equipment, electrical connection verification equipment, and/or other equipment may access component 26 in pocket 66 via opening 230. When the desired processing operations are completed, tool 228 may be removed and opening 230 may be closed. If desired, additional interlacing operations may take place after tool 228 is removed (e.g., equipment 120 may continue weaving).

Figure 37:
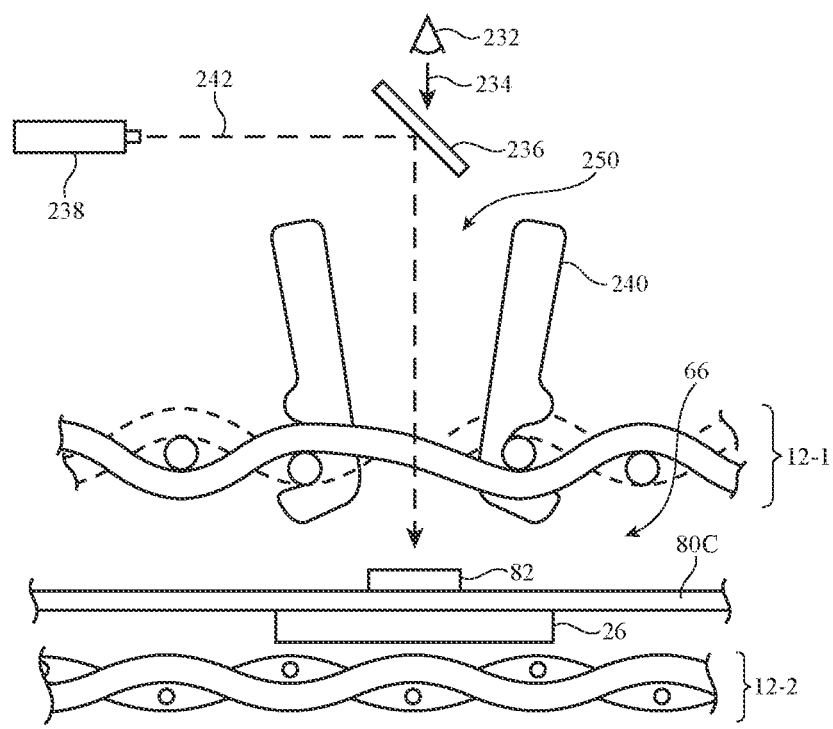
FIG. 37 is a cross-sectional side view of illustrative equipment that may be used to temporarily hold a portion of a fabric open during interlacing operations to provide access to an electrical component in the fabric in accordance with an embodiment.

In the example of FIG. 37, fabric opening tool 240 is used to hold a portion of fabric 12 open during interlacing operations. Tool 240 may have a tube-like shape and may be placed in alignment with component 26 in pocket 66. During interlacing operations, strands of upper fabric portion 12-1 may be interlaced around tool 240, thereby creating void 250 in upper fabric 12-1 that aligns with component 26. A viewer such as viewer 232 viewing fabric 12 in direction 234 (or a camera viewing fabric 12 in direction 234) may be able to see component 26 through opening 250. While tool 240 is in place, processing equipment such as insulation removal equipment, electrical connection (e.g., soldering) equipment, encapsulation equipment, electrical connection verification equipment, and/or other equipment may access component 26 in pocket 66 via opening 250 created by tool 240. For example, laser 238 may emit laser light 242 towards mirror 236, which in turn may reflect the laser light 242 through opening 250 toward solder 82 on component 26. The heat from laser light 242 may reflow solder 82 and thereby electrically couple component 26 to fabric 12. When the desired processing operations are completed, tool 240 may be removed and the opening in fabric 12 may be closed. If desired, additional interlacing operations may take place after tool 240 is removed (e.g., equipment 120 may continue weaving).

Figure 38:
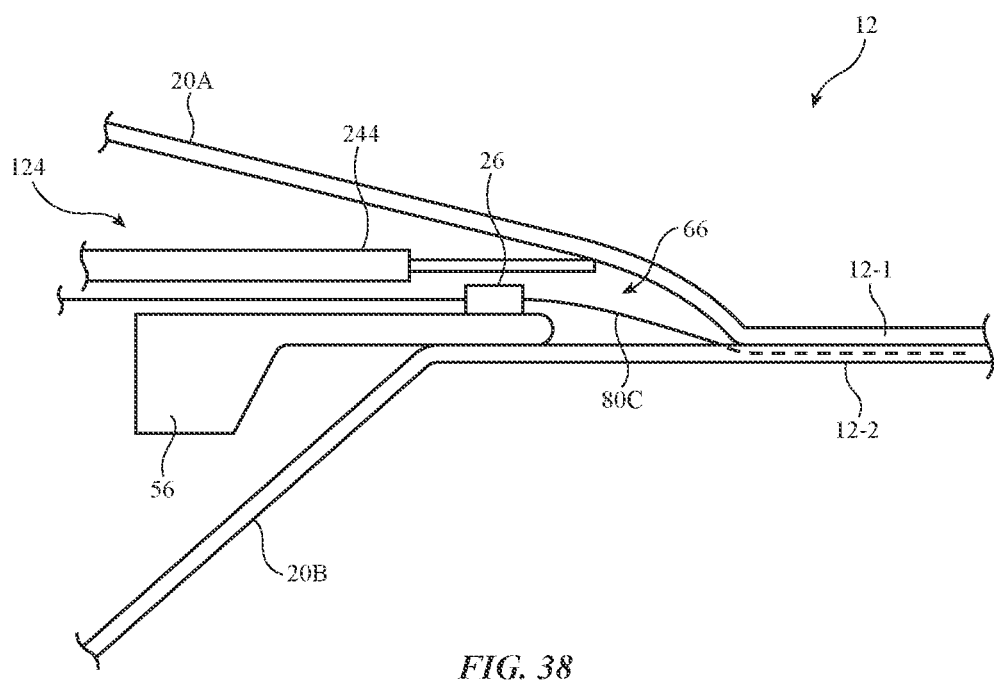
FIG. 38 is a side view showing how an insertion tool may insert an electrical component into a fabric pocket while an endoscopic laser is used to view the electrical component and to use laser light to solder the electrical component to conductive strands in accordance with an embodiment.

FIG. 38 is a side view of another illustrative example in which visual access to component 26 in pocket 66 is gained with an endoscope. As shown in FIG. 38, insertion tool 54 may insert component 26 into pocket 66. While insertion tool 54 holds component 26 in pocket 66, an optical device such as endoscope 244 may also be inserted into pocket 66. Endoscope 244 may have optical fibers that are used to gather endoscopic image data of component 26. An equipment operator and/or a computer-controlled positioning device may receive the endoscopic image data, which may in turn be used during alignment operations, insulation removal operations, soldering operations, encapsulation operations, and/or other processing operations. If desired, endoscope 244 may be a laser endoscope that can apply laser light to reflow solder on component 26 while also gathering endoscopic images of component 26. When the desired processing operations are completed, endoscope 244 and insertion tool 54 may be removed and interlacing operations may continue to close pocket 66.

As described above, one aspect of the present technology is the gathering and use of data available from specific and legitimate sources. The present disclosure contemplates that in some instances, this gathered data may include personal information data that uniquely identifies or can be used to identify a specific person. Such personal information data can include demographic data, location-based data, online identifiers, telephone numbers, email addresses, home addresses, data or records relating to a user's health or level of fitness (e.g., vital signs measurements, medication information, exercise information), date of birth, or any other personal information.

The present disclosure recognizes that the use of such personal information data, in the present technology, can be used to the benefit of users. For example, the personal information data can be used to deliver targeted content that may be of greater interest to the user in accordance with their preferences. Accordingly, use of such personal information data enables users to have greater control of the delivered content. Further, other uses for personal information data that benefit the user are also contemplated by the present disclosure. For instance, health and fitness data may be used, in accordance with the user's preferences to provide insights into their general wellness, or may be used as positive feedback to individuals using technology to pursue wellness goals.

The present disclosure contemplates that those entities responsible for the collection, analysis, disclosure, transfer, storage, or other use of such personal information data will comply with well-established privacy policies and/or privacy practices. In particular, such entities would be expected to implement and consistently apply privacy practices that are generally recognized as meeting or exceeding industry or governmental requirements for maintaining the privacy of users. Such information regarding the use of personal data should be prominent and easily accessible by users, and should be updated as the collection and/or use of data changes. Personal information from users should be collected for legitimate uses only. Further, such collection/sharing should occur only after receiving the consent of the users or other legitimate basis specified in applicable law. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations that may serve to impose a higher standard. For instance, in the US, collection of or access to certain health data may be governed by federal and/or state laws, such as the Health Insurance Portability and Accountability Act (HIPAA); whereas health data in other countries may be subject to other regulations and policies and should be handled accordingly.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, such as in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely block the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing identifiers, controlling the amount or specificity of data stored (e.g., collecting location data at city level rather than at an address level), controlling how data is stored (e.g., aggregating data across users), and/or other methods such as differential privacy.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users based on aggregated non-personal information data or a bare minimum amount of personal information, such as the content being handled only on the user's device or other non-personal information available to the content delivery services.

In accordance with a first embodiment, equipment for forming fabric having at least one conductive strand includes interlacing equipment that interlaces first strands and second strands to form the fabric; control circuitry that controls the interlacing equipment to create a gap between the first strands and the second strands; and an insertion tool that positions an electrical component in the gap and onto the at least one conductive strand, in which the control circuitry controls the interlacing equipment to continue interlacing the first strands and second strands after the insertion tool positions the electrical component in the gap and onto the at least one conductive strand.

In accordance with the first embodiment, the fabric includes a knit fabric and the interlacing equipment includes knitting equipment that knits the first strands and the second strands to form the knit fabric.

In accordance with the first embodiment, the fabric includes a woven fabric and the interlacing equipment includes weaving equipment that weaves the first strands and the second strands to form the woven fabric.

In accordance with the first embodiment, the first strands include first warp strands, the second strands include second warp strands, and the weaving equipment includes warp strand positioning equipment that positions the first warp strands and the second warp strands to create a shed; and weft strand positioning equipment that inserts a weft strand into the shed.

In accordance with the first embodiment, the equipment includes a support structure on which a portion of the fabric rests, in which the support structure includes dielectric material.

In accordance with the first embodiment, the equipment includes a hold-down bar that rests on the fabric, in which the control circuitry is configured to adjust a height of at least a portion of the hold-down bar relative to the fabric to accommodate the electrical component.

In accordance with the first embodiment, the hold-down bar has individually controlled portions that can be independently adjusted to different heights.

In accordance with the first embodiment, the equipment includes a reed through which the warp strands pass, in which the reed moves toward and away from the fabric, and in which the control circuitry is configured to momentarily pause motion of the reed while the insertion tool positions the electrical component in the gap.

In accordance with the first embodiment, the equipment includes take-down equipment with multiple independently-controlled rollers.

In accordance with the first embodiment, the equipment includes a laser that ablates an insulating coating on the at least one conductive strand to expose a conductive segment on the at least one conductive strand.

In accordance with the first embodiment, the interlacing equipment includes strand positioning equipment that positions the at least one conductive strand away from the first strands and second strands while the laser ablates the insulating coating on the at least one conductive strand.

In accordance with the first embodiment, the equipment includes a pyrometer that monitors a temperature of the fabric while the laser ablates the insulating coating on the at least one conductive strand.

In accordance with the first embodiment, the equipment includes a heating tool that reflows solder on the electrical component to attach the electrical component to the conductive segment.

In accordance with the first embodiment, the heating tool includes an inductive heating tool.

In accordance with a second embodiment, a method for forming fabric includes removing insulation from first and second strands to expose conductive segments; after removing insulation from the first and second strands, interlacing the first and second strands with other strands to create a cavity; positioning an electrical component in the cavity using an insertion tool and soldering the electrical component to the conductive segments in the cavity; and after inserting the electrical component into the cavity, interlacing the first and second strands with the other strands.

In accordance with the second embodiment, removing insulation from the first and second strands includes ablating the insulation using a laser.

In accordance with the second embodiment, positioning the electrical component in the cavity includes aligning the first and second strands with respective first and second grooves in the electrical component.

In accordance with the second embodiment, positioning the electrical component in the cavity includes sliding the electrical component along the first and second strands until the first and second grooves are aligned with the conductive segments in the cavity.

In accordance with the second embodiment, the electrical component includes an encapsulant material and soldering the electrical component to the conductive segments in the pocket includes using an inductive heating tool to reflow solder on the electrical component and melt the encapsulant material.

In accordance with a third embodiment, a fabric item includes first and second fabric portions; first and second conductive strands that pass between the first and second fabric portions; an electrical component interposed between the first and second fabric portions, in which the electrical component has a protective structure with first and second grooves and in which the electrical component is coupled to the first and second conductive strands via a first solder connection in the first groove and a second solder connection in the second groove; and an encapsulant material that at least partially encapsulates the first and second solder connections.

In accordance with the third embodiment, the encapsulant material includes thermoplastic material having a first melting temperature and the protective structure includes additional thermoplastic material having a second melting temperature that is higher than the first melting temperature.

In accordance with the third embodiment, the first and second conductive strands each have a conductive core surrounded by an insulating coating and a portion of the insulating coating has been removed to expose the conductive core on portions of the first and second conductive strands that pass through the first and second grooves.

The foregoing is merely illustrative and various modifications can be made by those skilled in the art without departing from the scope and spirit of the described embodiments. The foregoing embodiments may be implemented individually or in any combination.

What is claimed is:

1. Equipment for forming fabric having at least one conductive strand, the equipment comprising:
   interlacing equipment that interlaces first strands and second strands to create a formed fabric;
   control circuitry that controls the interlacing equipment to create a gap between first and second portions of the formed fabric; and
   an insertion tool that:
      aligns an electrical component with the at least one conductive strand; and
      moves into the gap to position the electrical component in the gap after the electrical component is electrically coupled to the at least one conductive strand, wherein the control circuitry controls the interlacing equipment to continue interlacing the first strands and second strands after the insertion tool positions the electrical component in the gap.

2. The equipment defined in claim 1 wherein the formed fabric comprises a woven fabric, wherein the interlacing equipment comprises weaving equipment that weaves the first strands and the second strands to form the woven fabric, and wherein the electrical component is hidden from view when the electrical component is positioned in the gap.

3. The equipment defined in claim 2 wherein the first strands include first warp strands, wherein the second strands include second warp strands, and wherein the weaving equipment comprises:
   warp strand positioning equipment that positions the first warp strands and the second warp strands to create a shed; and
   weft strand positioning equipment that inserts a weft strand into the shed.

4. The equipment defined in claim 3 further comprising a spreading tool that spreads apart some of the first warp strands to create an opening in the shed.

5. The equipment defined in claim 4 wherein the electrical component is electrically coupled to the at least one conductive strand via a solder connection, the equipment further comprising a soldering tool that accesses the electrical component through the opening to create the solder connection between the electrical component and the at least one conductive strand.

6. The equipment defined in claim 5 wherein the at least one conductive strand has an insulating coating and wherein the soldering tool applies heat to remove the insulating coating from a segment of the at least one conductive strand.

7. The equipment defined in claim 5 further comprising an encapsulation tool that accesses the electrical component through the opening to encapsulate the solder connection.

8. The equipment defined in claim 5 wherein the insertion tool positions and releases the electrical component in the gap after the soldering tool creates the solder connection, the equipment further comprising:
   a component retention tool that retains the electrical component in the gap after the insertion tool releases the electrical component in the gap.

9. The equipment defined in claim 8 wherein the control circuitry controls the interlacing equipment to continue interlacing to close the gap and wherein the component retention tool is removed from the fabric after the gap is closed.

10. The equipment defined in claim 5 wherein the electrical component has a groove and the solder connection is located in the groove.

11. The equipment defined in claim 3 further comprising a hold-down bar that rests on the formed fabric, wherein the control circuitry is configured to adjust a height of at least a portion of the hold-down bar relative to the formed fabric to accommodate the electrical component.

12. The equipment defined in claim 11 wherein the hold-down bar has individually controlled portions that can be independently adjusted to different heights.

13. The equipment defined in claim 3 further comprising a reed through which the first warp strands and second warp strands pass, wherein the reed moves toward and away from the formed fabric, and wherein the control circuitry is configured to momentarily pause motion of the reed while the insertion tool positions the electrical component in the gap.

14. The equipment defined in claim 1 further comprising take-down equipment with multiple independently-controlled rollers.

* * * * *